US009873108B2

(12) United States Patent
Majima et al.

(10) Patent No.: US 9,873,108 B2
(45) Date of Patent: Jan. 23, 2018

(54) METAL OXIDE MESOCRYSTAL, AND METHOD FOR PRODUCING SAME

(71) Applicant: JAPAN SCIENCE AND TECHNOLOGY AGENCY, Saitama (JP)

(72) Inventors: Tetsuro Majima, Suita (JP); Takashi Tachikawa, Suita (JP); Zhenfeng Bian, Suita (JP)

(73) Assignee: Japan Science and Technology Agency, Saitama (JP)

( * ) Notice: Subject to any disclaimer, the term of this patent is extended or adjusted under 35 U.S.C. 154(b) by 255 days.

(21) Appl. No.: 14/765,283

(22) PCT Filed: Dec. 2, 2013

(86) PCT No.: PCT/JP2013/082345
§ 371 (c)(1),
(2) Date: Jul. 31, 2015

(87) PCT Pub. No.: WO2014/119117
PCT Pub. Date: Aug. 7, 2014

(65) Prior Publication Data

US 2016/0001268 A1 Jan. 7, 2016

(30) Foreign Application Priority Data

Jan. 31, 2013 (JP) ................................ 2013-017258

(51) Int. Cl.
*B01J 23/80* (2006.01)
*C01G 23/053* (2006.01)
(Continued)

(52) U.S. Cl.
CPC ............ *B01J 23/80* (2013.01); *B01J 21/063* (2013.01); *B01J 21/066* (2013.01); *B01J 23/06* (2013.01);
(Continued)

(58) Field of Classification Search
CPC ....... B01J 23/80; B01J 21/063; C01G 23/053; C01G 53/00; C01G 53/04; C01G 3/02;
(Continued)

(56) References Cited

FOREIGN PATENT DOCUMENTS

| CN | 1807260 A | 7/2006 |
|---|---|---|
| CN | 101786669 A | 7/2010 |

(Continued)

OTHER PUBLICATIONS

Yang et al. Control of the formation of rod-like ZnO mesocrystals and their photocatalytic properties. CrystEngComm, 2013, 15, 2608. Apr. 14, 2013.*

(Continued)

*Primary Examiner* — John Uselding
(74) *Attorney, Agent, or Firm* — Flaster/Greenberg P.C.

(57) ABSTRACT

Various metal oxide mesocrystals can be synthesized in a simple manner by a method for producing a metal oxide mesocrystal, the method comprising the step of annealing an aqueous precursor solution comprising one or more metal oxide precursors, an ammonium salt, a surfactant, and water at 300 to 600° C. Composite mesocrystals consisting of a plurality of metal oxides or an alloy oxide can also be provided.

5 Claims, 11 Drawing Sheets

Room Temperature → 500° C.

Precursor — Nucleation — Growth → Intermediate — Topotactic Transformation → Mesocrystal P123, M⁺(Metal Ions)

(51) Int. Cl.

| | |
|---|---|
| ***C01G 53/00*** | (2006.01) |
| ***C01G 53/04*** | (2006.01) |
| ***C01G 3/02*** | (2006.01) |
| ***C01G 9/02*** | (2006.01) |
| ***C01B 13/18*** | (2006.01) |
| ***C01G 1/02*** | (2006.01) |
| ***B01J 21/06*** | (2006.01) |
| ***B01J 23/06*** | (2006.01) |
| ***B01J 23/72*** | (2006.01) |
| ***B01J 23/755*** | (2006.01) |
| ***B01J 35/00*** | (2006.01) |
| ***B01J 35/02*** | (2006.01) |
| ***B01J 37/12*** | (2006.01) |
| ***C01G 9/00*** | (2006.01) |
| ***C30B 19/08*** | (2006.01) |
| ***C30B 29/16*** | (2006.01) |
| ***C30B 29/22*** | (2006.01) |
| ***H01B 1/08*** | (2006.01) |
| ***B01J 23/10*** | (2006.01) |
| ***B01J 23/745*** | (2006.01) |
| ***B01J 23/75*** | (2006.01) |
| ***B01J 35/10*** | (2006.01) |
| ***B01J 37/02*** | (2006.01) |

(52) U.S. Cl.

CPC ............... *B01J 23/10* (2013.01); *B01J 23/72* (2013.01); *B01J 23/745* (2013.01); *B01J 23/75* (2013.01); *B01J 23/755* (2013.01); *B01J 35/002* (2013.01); *B01J 35/004* (2013.01); *B01J 35/006* (2013.01); *B01J 35/02* (2013.01); *B01J 35/023* (2013.01); *B01J 35/1009* (2013.01); *B01J 35/1014* (2013.01); *B01J 35/1061* (2013.01); *B01J 37/0203* (2013.01); *B01J 37/12* (2013.01); *C01B 13/18* (2013.01); *C01G 1/02* (2013.01); *C01G 3/02* (2013.01); *C01G 9/006* (2013.01); *C01G 9/02* (2013.01); *C01G 23/053* (2013.01); *C01G 53/00* (2013.01); *C01G 53/04* (2013.01); *C01G 53/40* (2013.01); *C30B 19/08* (2013.01); *C30B 29/16* (2013.01); *C30B 29/225* (2013.01); *H01B 1/08* (2013.01); *C01P 2002/72* (2013.01); *C01P 2002/84* (2013.01); *C01P 2004/04* (2013.01); *C01P 2004/62* (2013.01); *C01P 2004/64* (2013.01); *C01P 2006/12* (2013.01)

(58) Field of Classification Search

CPC .. C01G 9/02; C01G 1/02; C01B 13/18; C30B 19/08; H01B 1/08

See application file for complete search history.

(56) References Cited

FOREIGN PATENT DOCUMENTS

| | | | |
|---|---|---|---|
| JP | 2003-531083 | A | 10/2003 |
| JP | 2005/153207 | A | 6/2005 |
| JP | 2005-225705 | A | 8/2005 |
| JP | 2011/140426 | A | 7/2011 |
| JP | 2013-014451 | A | 1/2013 |
| WO | WO 99/37705 | A1 | 7/1999 |

OTHER PUBLICATIONS

Liu et al. Manipulating the Formation of NH4TiOF3 Mesocrystals: Effects of Temperature, Surfactant, and pH. Cryst. Growth Des. 2012, 2625-2633. Mar. 26, 2012.*

X. Li et al., "Mesoporous mesocrystal $Ce_{1-x}Zr_xO_2$ with enhanced catalytic property for CO conversion", Journal of Solid State Chemistry, 2009, vol. 182, pp. 2185-2190.

Z. Li et al., "Hollow Zinc Oxide Mesocrystals from an Ionic Liquid Precursor (ILP)", Advanced Materials, 2008, vol. 20, pp. 1279-1285.

D. Su et al., "Mesoporous Nickel Oxide Nanowires: Hydrothermal Synthesis, Characterisation and Applications for Lithium-Ion Batteries and Supercapacitors with Superior Performance", Chemistry, a European Journal, 2012, vol. 18, pp. 8224-8229.

M. Xu, et al., Electrochemical synthesis of leaf-like CuO mesocrystals and their lithium storage properties, RSC Advances, 2012, vol. 2 p. 2240-2243.

H. Xu et al, Hierarchical-Oriented Attachment: From One-Dimensional $Cu(OH)_2$ Nanowires to Two-Dimensional CuO Nanoleaves, Crystal Growth and Design, 2007, vol. 7, No. 12, p. 2720-2724.

Q. Chen et al., Anatase $TiO_2$ Mesocrystals Enclosed by (001) and (101) Facets; Synergistic Effects between $Ti^{3+}$and Facets for Their Photocatalytic Performance, Chemistry A European Journal, 2012, vol. 18, No. 40 p. 12584-12589.

Q. Chen et al., Anatase $TiO_2$ Mesocrystals Enclosed by (001) and (101) Facets; Synergistic Effects between $Ti^{3+}$and Facets for Their Photocatalytic Performance, Chemistry A European Journal, Supporting Information, 2012, p. 51-57.

J. Ye et al., Nanoporous Anatase $TiO_2$ Mesocrystals: Additive-Free Synthesis, Remarkable Crystalline-Phase Stability, and Improved Lithium Insertion Behavior, Journal of the American Chemical Society, 2011, vol. 133, No. 4, p. 933-940.

X. Zhao et al., Shape-and Size-Controlled Synthesis of Uniform Anatase $TiO_2$ Nanocuboids Enclosed by Active {100} and {001} Facets, Advanced Functional Materials, 2011, vol. 21, No. 18, p. 3554-3563.

Yao K. et al., Architectural Processes and Physiochemical Properties of CoO/ZnO and $Zn_{1-x}Co_xO/Co_{1-y}Zn_yO$ Nanocomposites, Journal of Physical Chemistry, 2009, vol. 113, No. 4, p. 1373-1385.

Z. Bian et al., Superior Electron Transport and Phtoocatalytic Abilities of Metal-Nanoparticle-Loaded $TiO_2$Superstructures, Journal of Physical Chemistry, 2012, vol. 116, No. 48, p. 25444-25453.

H. Li et al., Large ZnO Mesocrystals of Hexagonal Columnar Morphology Derived from Liquid Crystal Templates, the Journal of the American Ceramic Society, 2011, vol. 94, No. 10, p. 3267-3275.

T. Li et al., Controllable growth of ZnO mesocrystals using a facile electrochemical approach, Chemical Physics Letters, 2013, vol. 555, p. 154-158.

Lausser C. et al., Mesocrystals of Vanadium Pentoxide: A Comparative Evaluation of Three Different Pathways of Mesocrystal Synthesis from Tactosol Precursors, ACS Nano, 2011, vol. 5, No. 1, p. 107-114.

J. Cai et al., $TiO_2$ Mesocrystals: Synthesis, formation mechanisms and applications, Science China Chemistry, 2012, vol. 55, No. 11, p. 2318-2326.

B. Li et al., Facile synthesis and photocatalytic activity of ZnO—CuO nanocomposite, Superlattices and Microstructures, 2010, vol. 47, No. 5, p. 615-623.

Z. Bian et al., Superstructures of $TiO_2$ Crystalline Nanoparticles Yields Effective Conduction Pathways for Photogenerated Charges, the Journal of Physical Chemistry Letter 2012, vol. 3, No. 11 p. 1422-1427.

L. Zhou et al., A Facile Synethesis of Uniform $NH_4TiOF_3$ Mesocrystals and Their Conversion to $TiO_2$ Mesocrystals, Journal of the American Chemical Society, 2008, vol. 130, No. 4 p. 1309-1320.

M. Buscaglia, et al., Morphological Control of Hydrothermal $Ni(OH)_2$ in the Presence of Polymers and Surfactants: Nanocrystals, Mesocrystals, and Superstructures, Crystal Growth & Design, 2008, vol. 8, No. 10, p. 3847-3855.

R. Song, et al., Ordered Nanoparticle Superstructures, Advanced Materials, 2010, vol. 22, p. 1301-1330.

L. Zhou, et al., Mesocrystals—Properties and Application, the Journal of Physical Chemistry Letters, 2012, vol. 3, p. 620-628.

PCT Search Report for corresponding International Application No. PCT/JP2013/082345, 2 pages (English translation only), dated Aug. 7, 2014.

(56) References Cited

OTHER PUBLICATIONS

Written Opinion of the International Searching Authority (6 pages), dated Jul. 31, 2015.
International Preliminary Report on Patentability (10 pages), dated Jul. 31, 2015.
Japanese Office Action dated Sep. 5, 2017 in JP Application No. 2016-102699 (12 pages).
L. Yang et al., "Hierarchical $\beta$-$Ni(OH)_2$ and NiO Carnations Assembled from Nanosheet Building Blocks", Crystal Growth & Design, 2007, vol. 7, No. 12, pp. 2716-2719.
Y. Cui et al., "Lotus-Root-Like NiO Nanosheets and Flower-Like NiO Microspheres: Synthesis and Magnetic Properties", CrystEngComm, 2011, vol. 13, pp. 4930-4934.
Y. Liu et al., "Concave $Co_3O_4$ Octahedral Mesocrystal: Polymer-Mediated Synthesis and Sensing Properties", CrystEngComm, 2012, vol. 14, pp. 6264-6270.

* cited by examiner

METAL OXIDE MESOCRYSTAL, AND METHOD FOR PRODUCING SAME

BACKGROUND OF THE INVENTION

Field of the Invention

The present invention relates to metal oxide mesocrystals and a method for producing the same.

Description of Related Art

Metal oxide nanoparticles have been widely used in various applications, such as light water-splitting, photocatalysts for environmental cleanup, and dye-sensitized solar cells. However, metal oxide nanoparticles tend to agglomerate randomly, which causes the decrease in surface area, interface mismatching, and the like, thus contributing to reduction in, for example, photoactivity (such as photocatalytic activity) and light energy conversion efficiency.

To solve the above problems, metal oxide mesocrystals, which are superstructures in which metal oxide nanoparticles are self-assembled, are expected as a promising new material to be used for a variety of applications, such as photocatalysts for environmental cleanup and water-splitting, solar cells and like photoelectric conversion elements, batteries, and sensors (Non-patent Literature 1 and 2). Although many synthesis methods for metal oxide mesocrystals have been reported (Non-patent Literature 1 and 2), they require complicated procedures and often take a long time for synthesis; additionally, the only mesocrystals that can be synthesized by these methods are mesocrystals composed of a single metal oxide of a specific type.

CITATION LIST

Non-Patent Literature

NPL 1: R. -Q. Song et al., Adv. Mater. 22, 1301-1330 (2010)

NPL 2: L. Zhou et al., J. Phys. Chem. Lett. 3, 620-628 (2012)

BRIEF SUMMARY OF THE INVENTION

Technical Problem

On the other hand, the present inventors found that mesocrystals comprising titanium oxide nanoparticles can be synthesized by a simple method. The titanium oxide mesocrystals have both large specific surface areas and high charge transport ability, and thus are expected to find application in the solar energy industry, including photocatalysts. However, it was not possible to synthesize composite mesocrystals comprising two or more metal oxides, or composite mesocrystals comprising an alloy oxide.

If a general synthesis method that enables synthesis of various metal oxide mesocrystals in a simple manner can be established, the potential for application that makes use of the physical and chemical characteristics of individual substances is significantly expanded. Additionally, such a method is expected to lead to the development of composite mesocrystals, which has not been achieved, the composite mesocrystals comprising a plurality of metal oxides or an alloy oxide.

Therefore, an object of the present invention is to provide a method that makes it possible to synthesize various metal oxide mesocrystals in a simple manner, and metal oxide mesocrystals obtained by the method. Another object of the present invention is to provide composite mesocrystals comprising a plurality of metal oxides or an alloy oxide.

Solution to Problem

The present inventors conducted extensive research to achieve the above objects, and found that various metal oxide mesocrystals can be synthesized in a simple manner by annealing an aqueous precursor solution comprising one or more metal oxide precursors, an ammonium salt, a surfactant, and water under specific conditions. Composite mesocrystals comprising a plurality of metal oxides or an alloy oxide can also be provided when two or more metal oxide precursors are used in the synthesis. The inventors conducted additional research, and accomplished the present invention. More specifically, the present invention encompasses the following features.

Item 1. A method for producing a metal oxide mesocrystal, the method comprising the step of annealing an aqueous precursor solution comprising one or more metal oxide precursors, an ammonium salt, a surfactant, and water at 300 to 600° C.

Item 2. The method according to Item 1, wherein the one or more metal oxide precursors are a metal nitrate and/or a metal fluoride salt.

Item 3. The method according to Item 1 or 2, wherein the ammonium salt is $NH_4NO_3$.

Item 4. The method according to any one of Items 1 to 3, wherein the surfactant is at least one member selected from the group consisting of anionic surfactants, cationic surfactants, amphoteric surfactants, and nonionic surfactants.

Item 5. The method according to any one of Items 1 to 4, wherein, in the aqueous precursor solution, the ratio of metal oxide precursor to surfactant is 1 to 1000:1 (molar ratio), and the ratio of ammonium salt to surfactant is 1 to 1000:1 (molar ratio).

Item 6. A metal oxide mesocrystal obtained by the method according to any one of Items 1 to 5.

Item 7. A mesocrystal consisting of an oxide of a transition metal, except for titanium, the mesocrystal having a specific surface area of 0.5 $m^2/g$ or more and an average width of 0.01 to 1000 μm.

Item 8. A titanium oxide mesocrystal having an average width of 400 to 1000 nm and a specific surface area of 10 $m^2/g$ or more.

Item 9. A mesocrystal comprising two or more metals.

Item 10. The mesocrystal according to Item 9, which has a specific surface area of 0.5 $m^2/g$ or more.

Item 11. The mesocrystal according to Item 9 or 10, which consists of two or more metal oxides.

Item 12. The mesocrystal according to Item 11, wherein the metal oxides consists of two or more transition metal oxides.

Item 13. The mesocrystal according to Item 9 or 10, which consists of an oxide of an alloy.

Item 14. A composite material comprising a functional material and a layer formed on a surface of the functional material, the layer comprising the mesocrystals according to any one of Items 6 to 13.

Advantageous Effects of Invention

The present invention makes it possible to synthesize various metal oxide mesocrystals in a simple manner. The present invention also makes it possible to provide composite mesocrystals consisting of a plurality of metal oxides or an alloy oxide.

BRIEF DESCRIPTION OF THE SEVERAL VIEWS OF THE DRAWINGS

FIG. 4*a* shows the results of titanium oxide (Examples 1 to 3 and Comparative Examples 1 to 3), FIG. 4*b* shows the results of zinc oxide (Examples 4 to 6 and Comparative Example 4), FIG. 4*c* shows the results of nickel oxide (Examples 7 to 8 and Comparative Examples 5 to 6), FIG. 4*d* shows the results of copper oxide (Examples 9 to 11 and Comparative Examples 7 to 9), FIG. 4*e* shows the results of the zinc-nickel alloy oxide (Example 12), and FIG. 4*f* shows the results of the composite mesocrystal consisting of nanoparticles of an zinc oxide/copper oxide composite mesocrystal (Example 13).

(a) HAADF-STEM image of the ZnO/CuO mesocrystal.

(b) EDX spectrum of the ZnO/CuO mesocrystal (Kα peak in Cu is 8.04 keV, and Kα peak in Zn is 8.63 keV).

Figure 12:
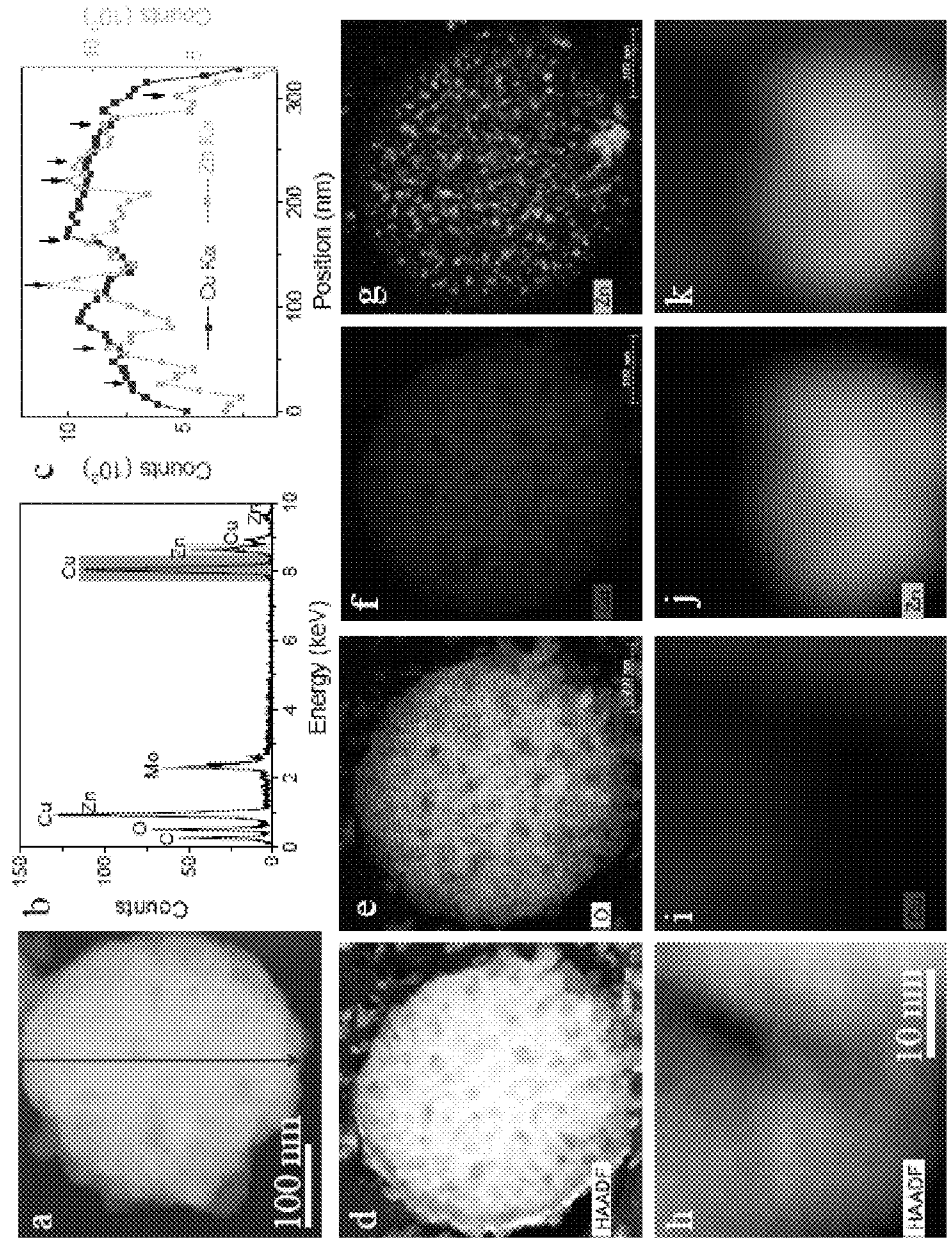
FIG. 12 shows diagrams illustrating the results of Test Example 7 (evaluation of properties of ZnO/CuO mesocrystal).

(c) EDX linescan profile obtained by scanning along the line in FIG. 12(*a*). The arrows indicate ZnO nanocrystals on the surface of the mesocrystal.

(d) Cross-sectional HAADF-STEM image of the ZnO/CuO mesocrystal.

(e) EDX elemental mapping of O of the ZnO/CuO mesocrystal cross section.

(f) EDX elemental mapping of Cu of the ZnO/CuO mesocrystal cross section.

(g) EDX elemental mapping of Zn of the ZnO/CuO mesocrystal cross section.

(h) High-resolution cross-sectional HAADF-STEM image of the ZnO/CuO mesocrystal.

(i) High-resolution EDX mapping of Cu of the ZnO/CuO mesocrystal cross section.

(j) High-resolution EDX mapping of Zn of the ZnO/CuO mesocrystal cross section.

(k) Composite image of FIG. 12(*i*) and FIG. 12(*j*).

Figure 13:
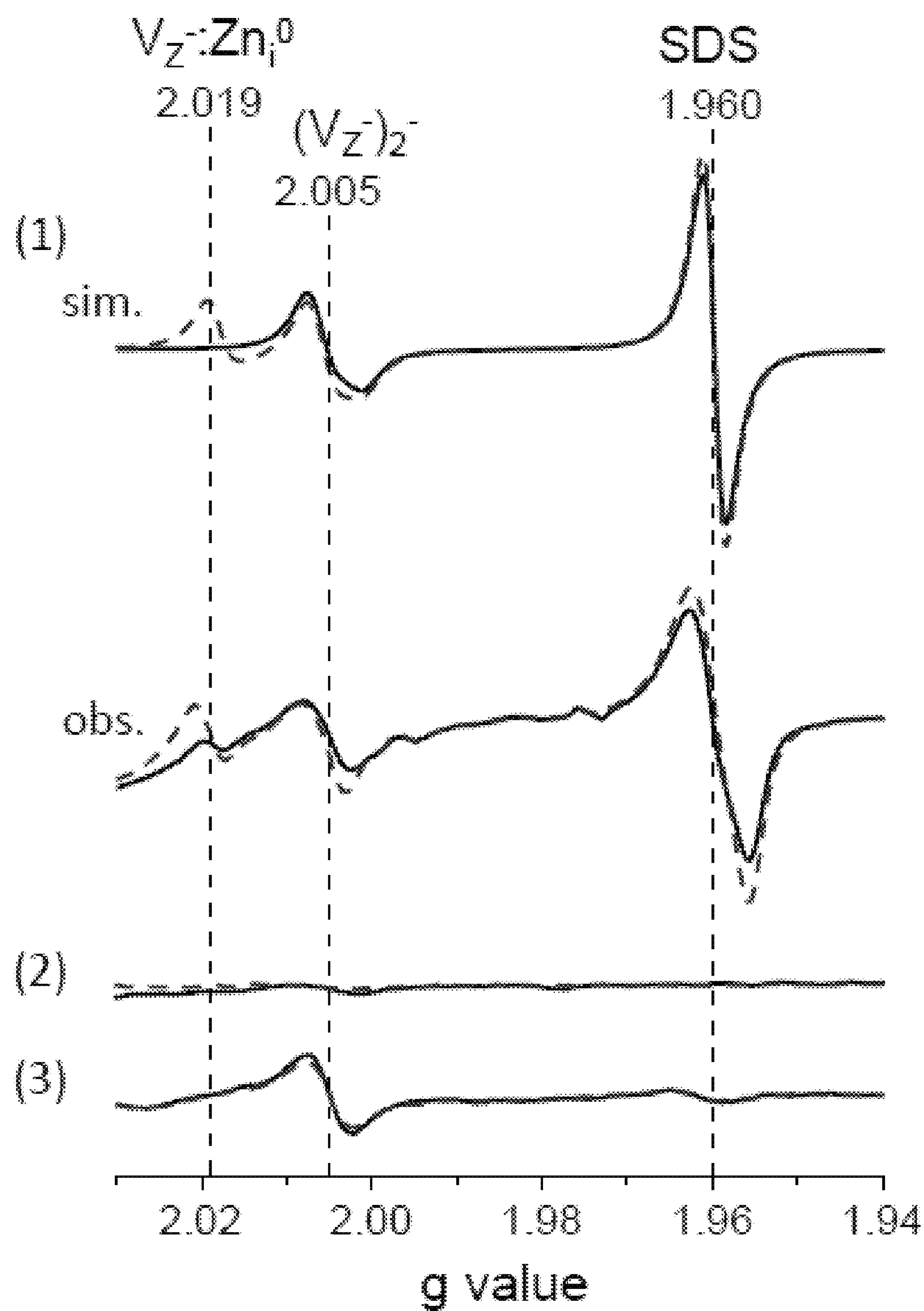

FIG. 13 is a diagram illustrating the results of Test Example 8 (EPR spectra). In FIG. 13, the solid lines indicate the results of the absence of UV irradiation, and the dashed lines indicate the results under UV irradiation. The abbreviation "sim." indicates simulated spectra, and "obs." indicates observed spectra.

(1) EPR spectra of ZnO (vacuum, 77K).

(2) EPR spectra of CuO (vacuum, 77K).

(3) EPR spectra of ZnO/CuO mesocrystal (vacuum, 77K).

Figure 14:
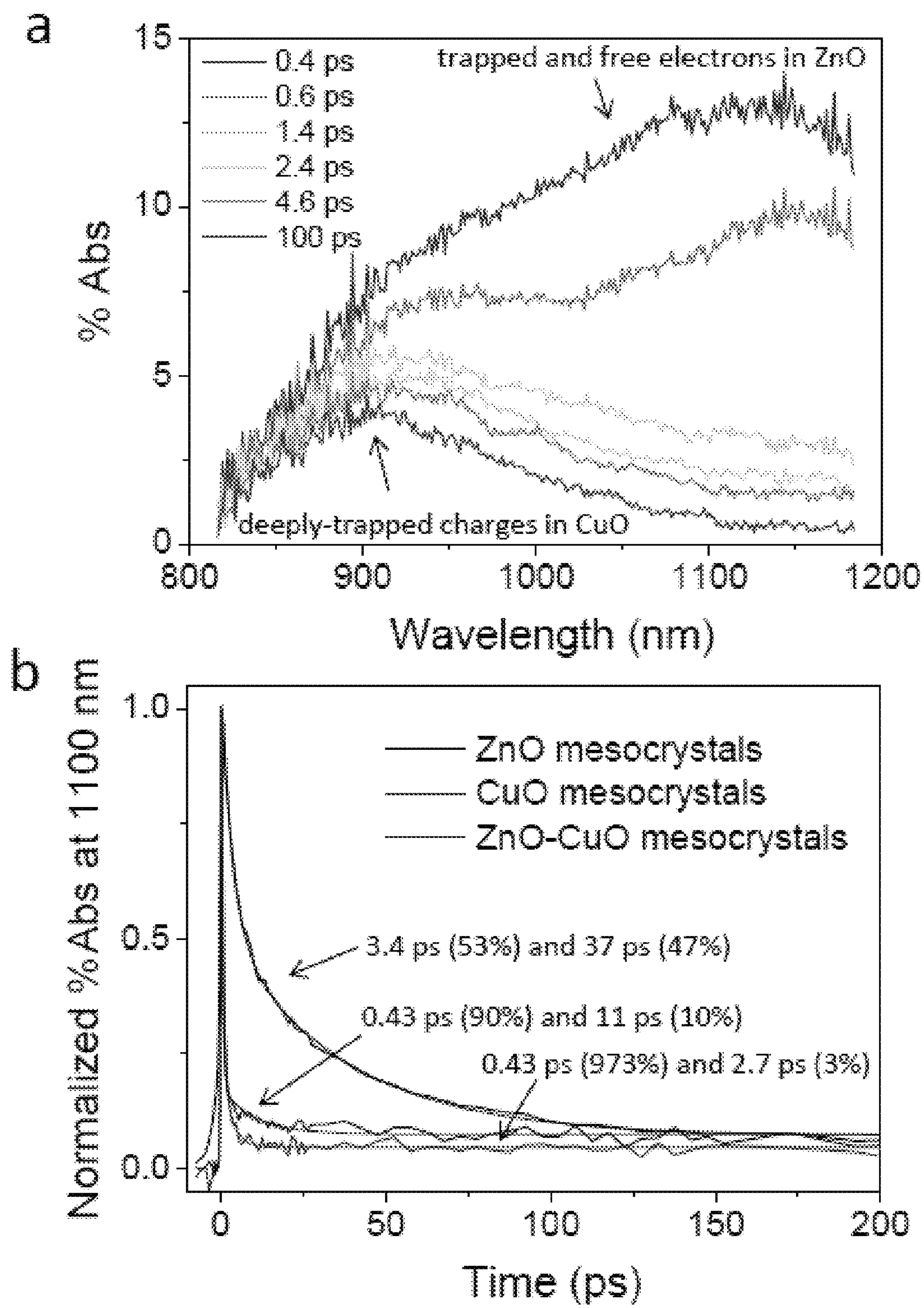

FIG. 14 shows diagrams illustrating the results of Test Example 9 (time-resolved diffuse reflectance spectroscopy). The thick lines and fine lines represent the experimental data and the fitting curves, respectively.

(a) Transient absorption spectrum of the ZnO/CuO mesocrystal.

(b) Time traces observed at 1100 nm.

DETAILED DESCRIPTION OF THE INVENTION

Figure 1:
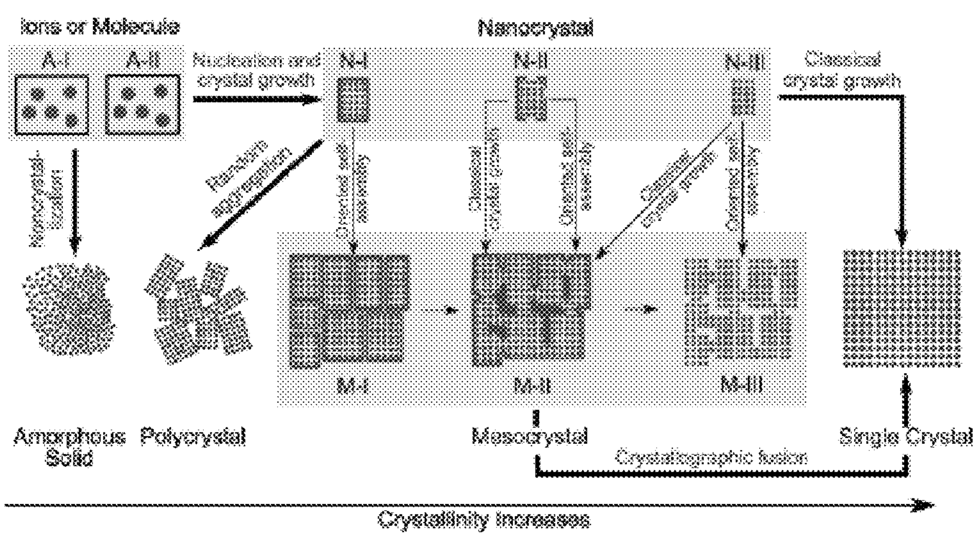
FIG. 1 is a conceptual diagram illustrating mesocrystals. N-I, N-II, and N-III show various metal oxide nanocrystals in which metal oxide nanoparticles are regularly arranged. M-I, M-II, and M-III show metal oxide mesocrystals in which these metal oxide nanoparticles are regularly arranged.

As used herein, "metal oxide mesocrystal" means a meso-sized (more specifically, about 0.01 to about 1000 μm, and in particular, about 100 nm to about 10 μm) crystalline superstructure in which metal oxide nanocrystals are regularly arranged. The superstructure means a structure in which nanoparticles or nanocrystals are regularly arranged, not a structure in which nanoparticles or nanocrystals agglomerate randomly (see FIG. 1; and FIG. 1 of L. Zhou et al., Small 2008, 4, 1566-1574). In FIG. 1, N-I, N-II, and N-III show various metal oxide nanocrystals in which metal oxide nanoparticles are regularly arranged; M-I, M-II, and M-III show metal oxide mesocrystals in which these metal oxide nanoparticles are regularly arranged. In this case, in the metal oxide mesocrystals, individual metal oxide nanoparticles are also regularly arranged. As described above, the metal oxide mesocrystals of the present invention are large-size crystals in which metal oxide nanocrystals do not agglomerate randomly, but are regularly arranged; therefore, random agglomeration can be suppressed.

The amorphous solid and polycrystal shown in the bottom-left portion of FIG. 1 indicates the states in which metal oxide nanoparticles or metal oxide nanocrystals agglomerate randomly.

Figure 2:
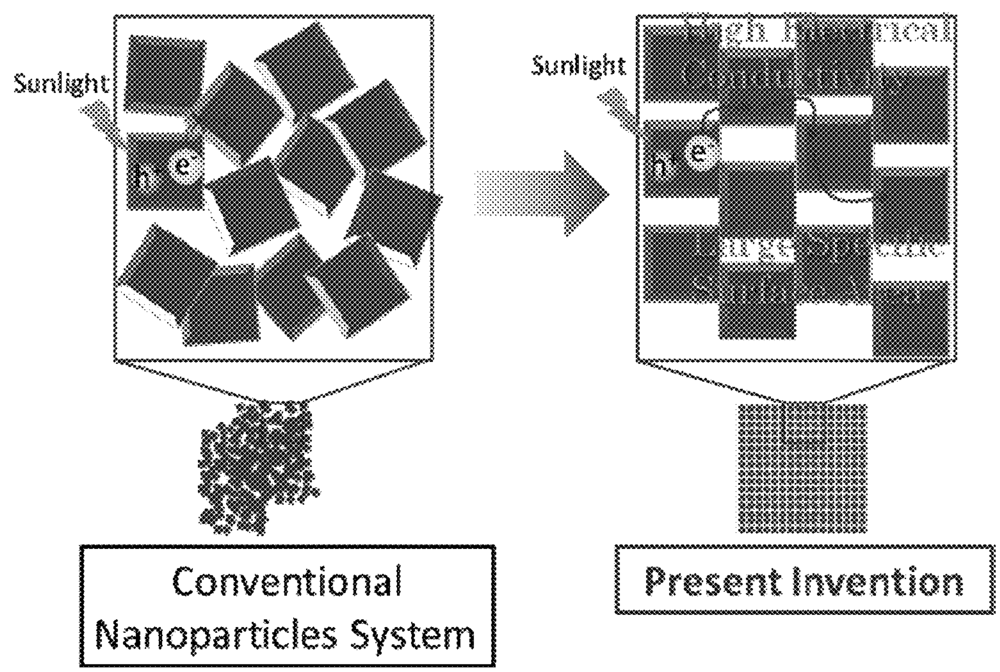
FIG. 2 is a conceptual diagram illustrating a conventional nanoparticulate system, and arrangement of metal oxide nanocrystals in the metal oxide mesocrystals of the present invention.

As shown in FIG. 2, in conventional random agglomerates, contact points between metal oxide nanocrystals are small (in FIG. 2, nanocrystals contact only at points), which reduces the conduction of electrons generated by sunlight. In contrast, in the metal oxide mesocrystals of the present invention, since metal oxide nanocrystals are regularly arranged, there are many contact points between the metal oxide nanocrystals (in FIG. 2, nanocrystals contact by lines), which facilitates the conduction of electrons and thus provides high electric conductivity. Additionally, since the metal oxide mesocrystals of the present invention enable suppression of agglomeration, a high specific surface area can be maintained even compared with the case in which metal oxide nanoparticles having a similar specific surface area are used, and photocatalytic activity can be significantly improved.

1. Method for Producing Metal Oxide Mesocrystals

The metal oxide mesocrystals of the present invention can be produced by a method comprising the step of annealing an aqueous precursor solution containing one or more metal oxide precursors, an ammonium salt, a surfactant, and water at 300 to 600° C. This method makes it possible to produce not only titanium oxide mesocrystals, but also various metal oxide mesocrystals.

In the method for producing a metal oxide mesocrystal of the present invention, the aqueous precursor solution is annealed at 300 to 600° C.

More specifically, a liquid layer comprising the aqueous precursor solution may be formed on a substrate, and annealed at 300 to 600° C.

There is no particular limitation on the substrate. The substrate may have a smooth surface at room temperature, and the surface may be flat or curved, or deformed when subjected to stress. Specific examples of usable substrates include silicon, various types of glass, transparent resins, and the like. When the annealing is performed at 400° C. or more, it is particularly preferable to use, for example, silicon or glass.

The thickness of the liquid layer is not particularly limited. Generally, the thickness of the liquid layer is preferably about 2 mm or less.

There is no particular limitation on the method for forming the liquid layer. A known method can be suitably employed depending on the type of substrate to be used. For example, dip coating, spin coating, or the like may be performed on the substrate, or a mixed solution of the substrate material and the aqueous precursor solution may be dripped onto silicon, glass, etc.

In addition to the above, a functional material can be used as a substrate, and a composite material of the functional material and any of the below-described mesocrystals of the present invention can be easily produced. Examples of functional materials include tin-doped indium oxide (ITO), fluorine-doped tin oxide (FTO), and the like.

The one or more metal oxide precursors contained in the aqueous precursor solution are not particularly limited, and are preferably a metal nitrate and/or a metal fluoride salt because the use of, for example, a metal chloride or a metal sulfate would make it difficult to regularly arrange metal oxide nanocrystals, i.e., make it difficult to obtain metal oxide mesocrystals. In particular, it is preferable that when a metal nitrate is present, the metal nitrate be used and that when no metal nitrate is present, a metal fluoride salt be used. More specifically, it is preferable to use $TiF_4$ as a titanium oxide precursor, $Zn(NO_3)_2$ as a zinc oxide precursor, $Ni(NO_3)_2$ as a nickel oxide precursor, $Cu(NO_3)_2$ as a copper oxide precursor, $Fe(NO_3)_2$ as an iron oxide precursor, $Co(NO_3)_2$ as a cobalt oxide precursor, $Zr(NO_3)_4$ as a zirconium oxide precursor, and $Ce(NO_3)_3$ as a cerium oxide precursor. In particular, when $TiF_4$ is used as a titanium oxide precursor, F ions are strongly adsorbed to the {001} planes of titanium oxide nanocrystals, and titanium oxide mesocrystals with the {001} planes as dominant crystal planes, i.e., large-sized titanium oxide mesocrystals, can be obtained.

Only one metal oxide precursor may be used, or two or more metal oxide precursors may be used. In particular, when a plurality of metal oxide precursors (i.e., a precursor of metal oxide A and a precursor of metal oxide B, which differs from the precursor of metal oxide A) is used, a composite mesocrystal consisting of a plurality of metal oxides or an alloy oxide can be obtained.

The amount of metal oxide precursor is as follows. The ratio of metal oxide precursor to surfactant is preferably 1 to 1000:1 (molar ratio), more preferably 20 to 150:1 (molar ratio), and even more preferably 25 to 130:1 (molar ratio). The amount of metal oxide precursor varies depending on the type of metal oxide in mesocrystals to be obtained. In the case of titanium oxide mesocrystals, the ratio of metal oxide precursor to surfactant is preferably 1 to 1000:1 (molar ratio), and particularly preferably 70 to 120:1 (molar ratio). In the case of zinc oxide mesocrystals, the ratio of metal oxide precursor to surfactant is preferably 1 to 1000:1 (molar ratio), and particularly preferably 100 to 150:1 (molar ratio). In the case of nickel oxide mesocrystals, the ratio of metal oxide precursor to surfactant is preferably 1 to 1000:1 (molar ratio), and particularly preferably 30 to 70:1 (molar ratio). In the case of copper oxide mesocrystals, the ratio of metal oxide precursor to surfactant is preferably 1 to 1000:1 (molar ratio), and particularly preferably 20 to 40:1 (molar ratio). In the case of composite mesocrystals as well, the preferable ratio varies depending on the types of metal oxides to be contained. In the case of composite oxide mesocrystals comprising zinc and copper, the zinc oxide precursor:copper oxide precursor:surfactant ratio is preferably 1 to 1000:1 to 1000:1 (molar ratio), and particularly preferably 30 to 50:15 to 25:1 (molar ratio). In the case of composite oxide mesocrystals comprising zinc and nickel, the zinc oxide precursor:nickel oxide precursor:surfactant ratio is preferably 1 to 1000:1 to 1000:1 (molar ratio), and particularly preferably 20 to 30:30 to 60:1 (molar ratio). The use of the one or more metal oxide precursors in amount(s) within the above ranges makes it possible to efficiently obtain mesocrystals in which individual oxide nanocrystals are arranged.

There is no particular limitation on the ammonium salt. Examples include $NH_4NO_3$, $NH_4Cl$, $NH_4ClO_4$, $(NH_4)_2SO_4$, $(NH_4)_2CO_3$, and the like. The ammonium salt is preferably $NH_4NO_3$ from the standpoint of homogeneity of metal oxide mesocrystals. These ammonium salts may be used singly, or in a combination of two or more.

The amount of ammonium salt is such that the ratio of ammonium salt to surfactant is preferably 1 to 1000:1 (molar ratio), more preferably 300 to 600:1 (molar ratio), and even more preferably 400 to 500:1 (molar ratio). The ammonium salt is used in an amount within the above ranges regardless of the type(s) of metal oxide(s) in mesocrystals to be obtained. The use of the ammonium salt in an amount within the above ranges makes it possible to effectively suppress agglomeration of metal oxide nanocrystals, and thus obtain more crystalline metal oxide mesocrystals.

In the production method of the present invention, a surfactant is used to regularly arrange metal oxide nanocrystals and to obtain metal oxide mesocrystals more efficiently. There is no particular limitation on the surfactant. Any surfactants, i.e., anionic surfactants, cationic surfactants, amphoteric surfactants, and nonionic surfactants may be used. There is no particular limitation on the anionic surfactant. The anionic surfactant preferably has, for example, one or more carboxyl group, sulfonic acid group, sulfuric acid ester groups, or a phosphoric acid ester groups as a hydrophilic group. Examples include carboxylic acid type surfactants, such as sodium palmitate and sodium stearate; sulfonic acid-type surfactants, such as sodium 1-dodecanesulfonate; sulfuric acid ester-type surfactants, such as sodium lauryl sulfate and sodium myristyl sulfate; and phosphoric acid ester-type surfactants, such as sodium lauryl phosphate.

There is no particular limitation on the cationic surfactant. The cationic surfactant preferably has one or more amine residues or ammonium salt residues as hydrophilic groups. Examples include dodecyltrimethylammonium chloride, tetradecyltrimethylammonium chloride, cetyltrimethylammonium bromide (CTAB), cetyltrimethylammonium chloride, stearyltrimethylammonium chloride, and like alkyltrimethylammonium salts; distearyldimethylammonium chloride and like dialkyldimethylammonium salts; benzalkonium chloride, benzalkonium bromide, and like alkylbenzyldimethylammonium salts; dodecylpyridinium chloride, cetylpyridinium chloride, and like alkylpyridinium salts; and the like.

There is no particular limitation on the amphoteric surfactant. Examples include lauryl dimethylaminoacetic acid betaine, stearyl dimethylaminoacetic acid betaine, and like alkyl betaine-type surfactants; cocamidopropyl betaine, lauramidopropyl betaine, and like fatty acid amide betaine-type surfactants; 2-alkyl-N-carboxymethyl-N-hydroxyethylimidazolinium betaine and like alkyl imidazole-type surfactants; sodium lauroyl glutamate, lauroylmethyl-β-alanine, and like amino acid-type surfactants; lauryldimethylamine N-oxide, oleyldimethylamine N-oxide, and like alkylamine oxides; lauramidopropyl hydroxy sulfobetaine and like sulfobetaine-type surfactants; and the like.

There is no particular limitation on the nonionic surfactant. The nonionic surfactant preferably has a polyoxyethylene skeleton as a hydrophilic group. More specifically, the nonionic surfactant is preferably a polyether having a polyoxyethylene skeleton, and more preferably a triblock copolymer having a polyoxyethylene skeleton. A preferable example of such polyethers is a compound represented by formula (1):

$$HO(CH_2CH_2O)_a(CH_2CH(CH_3)O)_b(CH_2CH_2O)_cH \quad (1),$$

wherein a to c are the same or different, a is 10 to 140, b is 10 to 90, and c is 10 to 140.

The above-described surfactants may be used singly, or in a combination of two or more.

Among these surfactants, surfactants having hydroxyl groups or carboxyl groups at both terminals, and surfactants having a hydroxyl group at one terminal and a carboxyl group at the other terminal are preferable in order to bond metal oxide nanocrystals together and regularly arrange the metal oxide nanocrystals. That is, carboxylic acid-type anionic surfactants and/or nonionic surfactants are preferable. Of these, nonionic surfactants are preferable, nonionic surfactants having one or more polyoxyethylene skeletons are more preferable, polyethers having one or more polyoxyethylene skeletons are even more preferable, and polyethers consisting of a triblock copolymer having one or more polyoxyethylene skeletons are particularly preferable. In particular, compounds represented by formula (1) above are preferable.

In such polyethers represented by formula (1), a is particularly preferably 10 to 30, b is particularly preferably 60 to 80, and c is particularly preferably 10 to 30. Among these, preferable is a polyether represented by the following formula:

$$HO(CH_2CH_2O)_{20}(CH_2CH(CH_3)O)_{70}(CH_2CH_2O)_{20}H.$$

In the production method of the present invention, water is used as a solvent. If the starting material is an organic material, an organic solvent can be used; however, since inorganic material(s) are used as the metal oxide precursor(s) in the present invention, it is preferable to use an aqueous solvent, and water is particularly preferable. The amount of water may be an excess amount relative to the other components; however, for film formation, it is preferable that the amount of water not be too high. More specifically, the ratio of water to surfactant may be about 1000 to 100000:1 (molar ratio).

In the production method of the present invention, the above-described aqueous precursor solution is annealed at 300 to 600° C., and preferably 400 to 500° C. Although the annealing temperature does not largely vary depending on the metal(s) contained in mesocrystals to be produced, it is preferably about 320° C. or more when nickel oxide mesocrystals are produced. Setting the temperature within the above ranges allows regular arrangement of metal oxide nanocrystals and causes a topotactic reaction (L. Zhou et al., J. Am. Chem. Soc. 2008, 130, 1309-1320) as well as thermal decomposition of the polyether, thereby obtaining the metal oxide mesocrystals of the present invention. When one metal oxide precursor is used, the obtained metal oxide mesocrystal is a single crystal. Even when two or more metal oxide precursors are used, a mesocrystal that is a single crystal can be obtained depending on a combination. If the annealing temperature is too low, metal oxide precursor(s) remain, and the specific surface area cannot be increased. If the annealing temperature is too high, the specific surface area decreases, thus deteriorating, for example, photocatalytic activity. In the case where titanium oxide mesocrystals are produced as metal oxide mesocrystals, titanium oxide generally cannot maintain the anatase form, which has high activity, and structurally changes to the rutile form when annealed at high temperature; however, in the present invention, titanium oxide can maintain the anatase form even when annealed at high temperature (near the upper limit of the above temperature ranges).

There is no particular limitation on the annealing atmosphere. The annealing atmosphere may be an air atmosphere or an oxygen atmosphere. In the present invention, the oxygen atmosphere is preferably an atmosphere of 100% oxygen gas, or a mixed gas-atmosphere of air and 90% or more oxygen.

Figure 3:
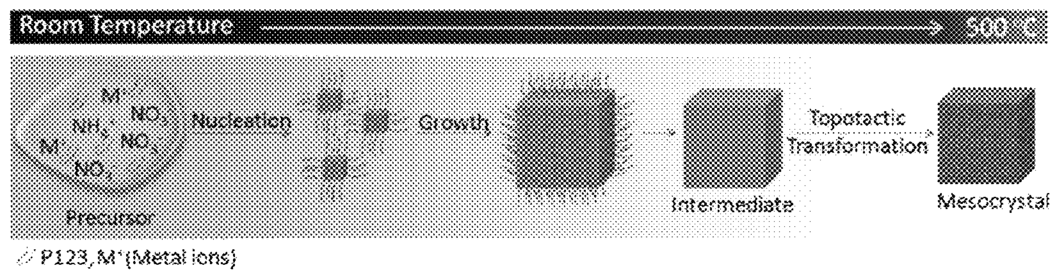
FIG. 3 is a conceptual diagram illustrating an example of the production method of the present invention.

FIG. 3 shows a conceptual diagram of an example of the production method of the present invention.

2. Mesocrystal Consisting of an Oxide of a Transition Metal, Except for Titanium The mesocrystal consisting of an oxide of a transition metal, except for titanium, of the present invention (which hereafter may be referred to as "mesocrystal A") is not particularly limited, and can be obtained by, for example, the above-described production method. More specifically, the mesocrystal A of the present invention can be obtained by using a precursor of a metal oxide, except for an oxide of titanium, as a metal oxide precursor in the production method described above.

The specific surface area of the mesocrystal A of the present invention is 0.5 $m^2/g$ or more, although it depends on the type of metal oxide that constitutes the mesocrystal. If the specific surface area of the mesocrystal A is too small, satisfactory photocatalytic activity or photocurrent lifetime cannot be obtained. Although the specific surface area of the mesocrystal A varies depending on the type of metal oxide that constitutes the mesocrystal, it is preferable that the specific surface area be about 0.5 to about 2 $m^2/g$ in zinc oxide mesocrystals, about 10 to about 20 $m^2/g$ in nickel oxide mesocrystals, and about 1 to about 5 $m^2/g$ in copper oxide mesocrystals. The specific surface areas of these mesocrystals can be increased compared with those of nanoparticles of respective oxides. The specific surface area of the mesocrystal A of the present invention can be measured by, for example, the BET method or the like.

There is no particular limitation on the metal oxide that constitutes the mesocrystal A. Examples include zinc oxide, nickel oxide, copper oxide, iron oxide, cobalt oxide, zirconium oxide, cerium oxide, and the like. Zinc oxide, nickel oxide, copper oxide, and the like are preferable.

Additionally, since metal oxide nanocrystals are regularly arranged in the mesocrystal A of the present invention as described above, the mesocrystal A of the present invention can be a single crystal as a whole.

There is no particular limitation on the shape of the mesocrystal A of the present invention. Although the resulting shape varies depending on the type of metal oxide, the average width is preferably about 0.01 to about 1000 μm, and more preferably about 0.1 to about 5 μm. In the mesocrystal A of the present invention, the average width means, when the mesocrystals are assumed to be plate-like crystals having square- or rectangle-shaped surfaces, the average value of the sides of the squares or the rectangles. In the case of zinc oxide mesocrystals, columnar crystals having a width of about 0.5 to about 1.5 μm, and a length of about 1 to about 5 μm are easily obtained. In the case of nickel oxide mesocrystals, substantially spherical crystals having a diameter of about 100 to about 300 nm are easily obtained. In the case of copper oxide mesocrystals, substantially spherical crystals having a diameter of about 500 to about 1000 nm are easily obtained. The shape of the mesocrystal A of the present invention is measured by electron microscopic observation (SEM, TEM, etc.).

To obtain more excellent photocatalytic activity, the average particle size of the metal oxide nanocrystals that constitute the mesocrystal A of the present invention is preferably about 5 to about 60 nm, and more preferably about 10 to about 50 nm. The average particle size of the metal oxide nanocrystals is measured by, for example, powder X-ray diffraction (using the Scherrer equation).

To further increase the specific surface area, the mesocrystal A of the present invention preferably has a larger pore size. More specifically, the average pore size is preferably about 2 to about 60 nm. The average pore size is measured from, for example, adsorption isotherm using BJH model.

3. Titanium Oxide Mesocrystal

The titanium oxide mesocrystal of the present invention (which hereafter may be referred to as "mesocrystal B") is not particularly limited, and can be obtained by, for example, the above-described production method. More specifically, the titanium oxide mesocrystal of the present invention can be obtained by using a titanium oxide precursor as a metal oxide precursor in the production method described above.

The mesocrystal B of the present invention preferably has an average width of 0.01 to 1000 μm, and preferably 400 to 1000 nm, and a specific surface area of 10 $m^2/g$ or more.

Additionally, since titanium oxide nanocrystals are regularly arranged in the mesocrystal B of the present invention as described above, the mesocrystal B of the present invention can be a single crystal as a whole.

In the mesocrystal B of the present invention, the width is preferably sufficiently large compared to the thickness. More specifically, the ratio of average width to average thickness (average width/average thickness) is preferably about 5 to about 50, and more preferably about 10 to about 20. Setting the ratio of average width to average thickness within the above ranges can more effectively suppress not only disintegration of crystals, but also agglomeration. The shape of the mesocrystal B of the present invention is measured by electron microscopic observation (SEM, TEM, etc.).

In addition, when the ratio of average width to average thickness is large as described above, the mesocrystal B of the present invention can have {001} planes with high surface energy as dominant crystal planes. The {001} plane attracts attention as a highly active crystal plane (G. Liu et al., Chem. Commun. 2011, 47, 6763-6783). Thus, photocatalytic activity etc. can be further improved by having {001} planes as dominant crystal planes.

Since the ratio of average width to average thickness is preferably large as described above, the average width is preferably larger. The average thickness is preferably smaller. More specifically, the average width is about 400 to about 1000 nm, and preferably about 500 to about 800 nm; the average thickness is preferably about 20 to about 500 nm, and more preferably about 50 to about 200 nm. The shape of the mesocrystal B of the present invention is measured by electron microscopic observation (SEM, TEM, etc.).

In the mesocrystal B of the present invention, the average width means, when the mesocrystals are assumed to be plate-like crystals having square- or rectangle-shaped surfaces, the average value of the sides of the squares or the rectangles. The average thickness of the mesocrystal B of the present invention means the following: in the case where the mesocrystals are plate-like crystals, the average thickness is the average value of thickness of plate-like crystals, and in the case where the mesocrystals are not plate-shaped, the average thickness is the average value of thickness when the mesocrystals are assumed to be plate-like crystals. The width and thickness are measured by, for example, electron microscopic observation (such as SEM).

The mesocrystal B of the present invention has a specific surface area of 10 $m^2/g$ or more. If the specific surface area of mesocrystal B is too small, satisfactory photocatalytic activity or photocurrent lifetime cannot be obtained. In the present invention, the specific surface area of the mesocrystal B can be larger than 50 $m^2/g$, the specific surface area of titanium oxide nanoparticles P25, which is a typical photocatalyst. The specific surface area of the mesocrystal B is preferably about 10 to about 150 $m^2/g$, more preferably about 50 to about 110 $m^2/g$, and even more preferably about 80 to about 100 $m^2/g$. The specific surface area of the mesocrystal B of the present invention is measured by, for example, the BET method.

The titanium oxide nanocrystals that constitute the mesocrystal B of the present invention may be in the anatase form or the rutile form. In particular, the mesocrystal B of the present invention is preferably an assembly of anatase-type titanium oxide nanocrystals because high catalytic activity is obtained. The crystal structure of the titanium oxide nanocrystals is measured by, for example, powder X-ray diffraction.

To obtain more excellent photocatalytic activity, the average particle size of the titanium oxide nanocrystals that constitute the mesocrystal B of the present invention is preferably about 10 to about 70 nm, and more preferably about 20 to about 30 nm. The average particle size of the titanium oxide nanocrystals is measured by, for example, powder X-ray diffraction (using the Scherrer equation).

To further increase the specific surface area, the mesocrystal B of the present invention preferably has a larger pore size. More specifically, the average pore size is preferably about 5 to about 15 nm, and more preferably about 9 to about 13 nm. The average pore size is measured from, for example, adsorption isotherm using BJH model.

The shape of the mesocrystal B of the present invention may be plate-shaped or of other shapes. In particular, the shape of the mesocrystal B of the present invention is preferably plate-shaped because the ratio of average width to average thickness is preferably large in order for mesocrystals to have {001} planes with high surface energy as dominant crystal planes.

4. Mesocrystal Comprising Two or More Metals

The mesocrystal comprising two or more metals of the present invention (which hereafter may be referred to as "mesocrystal C") is not particularly limited, and can be obtained by, for example, the above-described production method. More specifically, the mesocrystal C of the present invention can be obtained by using two or more metal oxide precursors as metal oxide precursors in the production method described above (for example, using a precursor of metal oxide A and a precursor of metal oxide B). The use of two or more metal oxide precursors makes it possible to obtain a mesocrystal consisting of nanoparticles of two or more metal oxides, and a mesocrystal consisting of nanoparticles of an alloy oxide.

Although it depends on the types of metal oxides that constitute the mesocrystal C of the present invention, the mesocrystal C of the present invention has a specific surface area of preferably 0.5 $m^2/g$ or more, and more preferably 1 $m^2/g$ or more. There is no particular limitation on the upper limit. Photocatalytic activity and photocurrent lifetime can be further improved by increasing the specific surface area of the mesocrystal C. Although the specific surface area of the mesocrystal C varies depending on the metal oxides that constitute the mesocrystal C, mesocrystals consisting of zinc oxide and copper oxide preferably have a specific surface area of about 1 to about 10 $m^2/g$, and mesocrystals consisting of an oxide of an alloy of zinc and nickel preferably have a specific surface area of about 10 to about 20 $m^2/g$. The specific surface area of the mesocrystal C of the present invention is measured by, for example, the BET method.

There is no particular limitation on the metals that constitute the mesocrystal C. Examples include two or more metals selected from the group consisting of titanium, zinc, nickel, copper, iron, cobalt, zirconia, cerium, and the like. Two or more metals selected from the group consisting of titanium, zinc, nickel, copper, and the like are preferable. More specifically, the mesocrystal C preferably consists of nanoparticles of two or more metal oxides selected from the group consisting of titanium oxide, zinc oxide, nickel oxide, copper oxide, and the like, or preferably consists of nanoparticles of an oxide of an alloy of two or more metals selected from the group consisting of titanium, zinc, nickel, copper, and the like.

In addition, in the mesocrystal C of the present invention, metal oxide nanocrystals or alloy oxide nanocrystals are regularly arranged to form the mesocrystal as described above.

When the mesocrystal C of the present invention is, for example, a mesocrystal consisting of nanoparticles of two or more metal oxides, the nanoparticles of each metal oxide may be distributed on a single crystal consisting of the two or more metal oxides that constitute the mesocrystal.

There is no particular limitation on the shape of the mesocrystal C of the present invention. Although the resulting shape varies depending on the types of metals that constitute the mesocrystal C, substantially spherical crystals having a diameter of about 500 to about 1500 nm are easily obtained. The shape of the mesocrystal C of the present invention is measured by electron microscopic observation (SEM, TEM, etc.).

To obtain more excellent photocatalytic activity, the average particle size of the metal oxide nanocrystals or alloy nanocrystals that constitute the mesocrystal C of the present invention is preferably about 5 to about 60 nm, and more preferably about 10 to about 50 nm. The average particle size of the metal oxide nanocrystals or alloy nanocrystals is measured by, for example, powder X-ray diffraction (using the Scherrer equation).

To further increase the specific surface area, the mesocrystal C of the present invention preferably has a larger pore size. More specifically, the average pore size is preferably about 20 to about 60 nm. The average pore size is measured from, for example, adsorption isotherm using BJH model.

5. Use

As described above, the metal oxide mesocrystals of the present invention have large specific surface areas, comprise metal oxide nanocrystals that are regularly arranged, and are large size crystals; accordingly, agglomeration can be suppressed. Therefore, the metal oxide mesocrystals of the present invention have high photocatalytic activity and high conductivity. The present invention makes it possible to obtain mesocrystals that have heretofore been unable to be obtained, the mesocrystals comprising two or more metals, and makes it possible to further improve photocatalytic ability. The present invention is also excellent in mass production because it enables the mesocrystals to be produced by a very simple method. Therefore, such mesocrystals can be used in various applications, such as photocatalysts for environmental cleanup, photocatalysts for hydrogen generation, dye-sensitized solar cells, and lithium-ion batteries.

EXAMPLES

Examples are given below to illustrate the present invention in more detail; however, the present invention is not limited to these Examples.

Examples and Comparative Examples

Titanium Oxide

Example 1: Annealing at 500° C. (Meso-$TiO_2$-500)

A liquid layer consisting of an aqueous precursor solution containing $TiF_4$, $NH_4NO_3$, and P123: $HO(CH_2CH_2O)_{20}(CH_2CH(CH_3)O)_{70}(CH_2CH_2O)_{20}H$, which is a surfactant, (the composition was $TiF_4$:$NH_4NO_3$:P123:$H_2O$=93:453:1:32000 (molar ratio)) was formed on a silicon substrate. More specifically, the aqueous precursor solution was dripped onto the substrate. The thickness of the liquid layer was adjusted to about 1 mm. The liquid layer formed on the silicon substrate was annealed at 500° C. under air atmosphere for 2 hours, thereby forming the titanium oxide mesocrystal of Example 1 on the silicon substrate. The starting materials used in the aqueous precursor solution were all commercially available products.

Example 2: Annealing at 350° C. (Meso-$TiO_2$-350)

The titanium oxide mesocrystal of Example 2 was prepared in the same manner as in Example 1, except that the annealing temperature was 350° C.

Example 3: Annealing at 300° C. (Meso-$TiO_2$-300)

The titanium oxide mesocrystal of Example 3 was prepared in the same manner as in Example 1, except that the annealing temperature was 300° C.

Comparative Example 1: Annealing at 250° C. ($TiO_2$-250)

The titanium oxide crystal-containing mixture of Comparative Example 1 was prepared in the same manner as in Example 1, except that the annealing temperature was 250° C.

Comparative Example 2: Annealing at 200° C. ($TiO_2$-200)

The titanium oxide crystal-containing mixture of Comparative Example 2 was prepared in the same manner as in Example 1, except that the annealing temperature was 200° C.

Comparative Example 3: Annealing at 150° C. ($TiO_2$-150)

The titanium oxide crystal-containing mixture of Comparative Example 3 was prepared in the same manner as in Example 1, except that the annealing temperature was 150° C.

Zinc Oxide

Example 4: Annealing at 500° C. (Meso-ZnO-500)

A liquid layer consisting of an aqueous precursor solution containing $Zn(NO_3)_2$, $NH_4NO_3$, and P123: $HO(CH_2CH_2O)_{20}(CH_2CH(CH_3)O)_{70}(CH_2CH_2O)_{20}H$, which is a surfactant, (the composition was $Zn(NO_3)_2$:$NH_4NO_3$:P123:$H_2O$=126:453:1:32000 (molar ratio)) was formed on a silicon substrate. More specifically, the aqueous precursor solution was dripped onto the substrate. The thickness of the liquid layer was adjusted to about 1 mm. The liquid layer formed on the silicon substrate was annealed at 500° C. under air atmosphere for 2 hours, thereby forming the zinc oxide mesocrystal of Example 4 on the silicon substrate. The starting materials used in the aqueous precursor solution were all commercially available products.

Example 5: Annealing at 350° C. (Meso-ZnO-350)

The zinc oxide mesocrystal of Example 5 was prepared in the same manner as in Example 4, except that the annealing temperature was 350° C.

Example 6: Annealing at 300° C. (Meso-ZnO-300)

The zinc oxide mesocrystal of Example 6 was prepared in the same manner as in Example 4, except that the annealing temperature was 300° C.

Comparative Example 4: Annealing at 250° C. (ZnO-250)

The zinc oxide crystal-containing mixture of Comparative Example 4 was prepared in the same manner as in Example 4, except that the annealing temperature was 250° C.

Nickel Oxide

Example 7: Annealing at 500° C. (Meso-NiO-500)

A liquid layer consisting of an aqueous precursor solution containing $Ni(NO_3)_2$, $NH_4NO_3$, P123: $HO(CH_2CH_2O)_{20}(CH_2CH(CH_3)O)_{70}(CH_2CH_2O)_{20}H$, which is a surfactant, (the composition was $Ni(NO_3)_2$:$NH_4NO_3$:P123:$H_2O$=55:453:1:32000 (molar ratio)) was formed on a silicon substrate. More specifically, the aqueous precursor solution was dripped onto the substrate. The thickness of the liquid layer was adjusted to about 1 mm. The liquid layer formed on the silicon substrate was annealed at 500° C. under air atmosphere for 2 hours, thereby forming the nickel oxide mesocrystal of Example 7 on the silicon substrate. The starting materials used in the aqueous precursor solution were all commercially available products.

Example 8: Annealing at 350° C. (Meso-NiO-350)

The nickel oxide mesocrystal of Example 8 was prepared in the same manner as in Example 7, except that the annealing temperature was 350° C.

Comparative Example 5: Annealing at 300° C. (NiO-300)

The nickel oxide crystal-containing mixture of Comparative Example 5 was prepared in the same manner as in Example 7, except that the annealing temperature was 300° C.

Comparative Example 6: Annealing at 250° C. (NiO-250)

The nickel oxide crystal-containing mixture of Comparative Example 6 was prepared in the same manner as in Example 7, except that the annealing temperature was 250° C.

Copper Oxide

Example 9: Annealing at 500° C. (Meso-CuO-500)

A liquid layer consisting of an aqueous precursor solution containing $Cu(NO_3)_2$, $NH_4NO_3$, P123: $HO(CH_2CH_2O)_{20}(CH_2CH(CH_3)O)_{70}(CH_2CH_2O)_{20}H$, which is a surfactant, (the composition was $Cu(NO_3)_2$:$NH_4NO_3$:P123:$H_2O$=29:453:1:32000 (molar ratio)) was formed on a silicon substrate. More specifically, the aqueous precursor solution was dripped onto the substrate. The thickness of the liquid layer was adjusted to about 1 mm. The liquid layer formed on the silicon substrate was annealed at 500° C. under air atmosphere for 2 hours, thereby forming the copper oxide mesocrystal of Example 9 on the silicon substrate. The starting materials used in the aqueous precursor solution were all commercially available products.

Example 10: Annealing at 350° C. (Meso-CuO-350)

The copper oxide mesocrystal of Example 10 was prepared in the same manner as in Example 9, except that the annealing temperature was 350° C.

Example 11: Annealing at 300° C. (Meso-CuO-300)

The copper oxide mesocrystal of Example 11 was prepared in the same manner as in Example 9, except that the annealing temperature was 300° C.

Comparative Example 7: Annealing at 250° C. (CuO-250)

The copper oxide crystal-containing mixture of Comparative Example 7 was prepared in the same manner as in Example 9, except that the annealing temperature was 250° C.

Comparative Example 8: Annealing at 200° C. (CuO-200)

The copper oxide crystal-containing mixture of Comparative Example 8 was prepared in the same manner as in Example 9, except that the annealing temperature was 200° C.

Comparative Example 9: Annealing at 150° C. (CuO-150)

The copper oxide crystal-containing mixture of Comparative Example 9 was prepared in the same manner as in Example 9, except that the annealing temperature was 150° C.

Composite Type

Example 12: Mesocrystal Consisting of Zinc Oxide Nanoparticles and Copper Oxide Nanoparticles (Meso-ZnO/CuO-500)

A liquid layer consisting of an aqueous precursor solution containing $Zn(NO_3)_2$, $Cu(NO_3)_2$, $NH_4NO_3$, and P123:$HO(CH_2CH_2O)_{20}(CH_2CH(CH_3)O)_{70}(CH_2CH_2O)_{20}H$, which is a surfactant, (the composition was $Zn(NO_3)_2$:$Cu(NO_3)_2$:$NH_4NO_3$:P123:$H_2O$=39:20:453:1:32000 (molar ratio)) was formed on a silicon substrate. More specifically, the aqueous precursor solution was dripped onto the substrate. The thickness of the liquid layer was adjusted to about 1 mm. The liquid layer formed on the silicon substrate was annealed at 500° C. under air atmosphere for 2 hours, thereby forming the zinc oxide/copper oxide composite mesocrystal of Example 12 on the silicon substrate. The starting materials used in the aqueous precursor solution were all commercially available products.

Example 13: Mesocrystal Consisting of Nanoparticles of an Oxide of a Zinc-Nickel Alloy (Meso-ZnNiO-500)

A liquid layer consisting of an aqueous precursor solution containing $Zn(NO_3)_2$, $Ni(NO_3)_2$, $NH_4NO_3$, and P123:$HO(CH_2CH_2O)_{20}(CH_2CH(CH_3)O)_{70}(CH_2CH_2O)_{20}H$, which is a surfactant, (the composition was $Zn(NO_3)_2$:$Ni(NO_3)_2$:$NH_4NO_3$:P123:$H_2O$=25:44:453:1:32000 (molar ratio)) was formed on a silicon substrate. More specifically, the aqueous precursor solution was dripped onto the substrate. The thickness of the liquid layer was adjusted to about 1 mm. The liquid layer formed on the silicon substrate was annealed at 500° C. under air atmosphere for 2 hours, thereby forming the composite mesocrystal consisting of nanoparticles of an oxide of a zinc-nickel alloy of Example 13 on the silicon substrate. The starting materials used in the aqueous precursor solution were all commercially available products.

Evaluation

Test Example 1: Specific Surface Area

The specific surface area of each of the mesocrystals of Examples 1, 4, 7, 9, 12, and 13 was measured by the BET method. Table 1 shows the results.

Test Example 2: Pore Size

The pore size of each of the mesocrystals of Examples 1, 4, 7, 9, 12, and 13 was measured by the BJH method. Table 1 shows the results.

Test Example 3: X-Ray Diffraction

Figure 4:
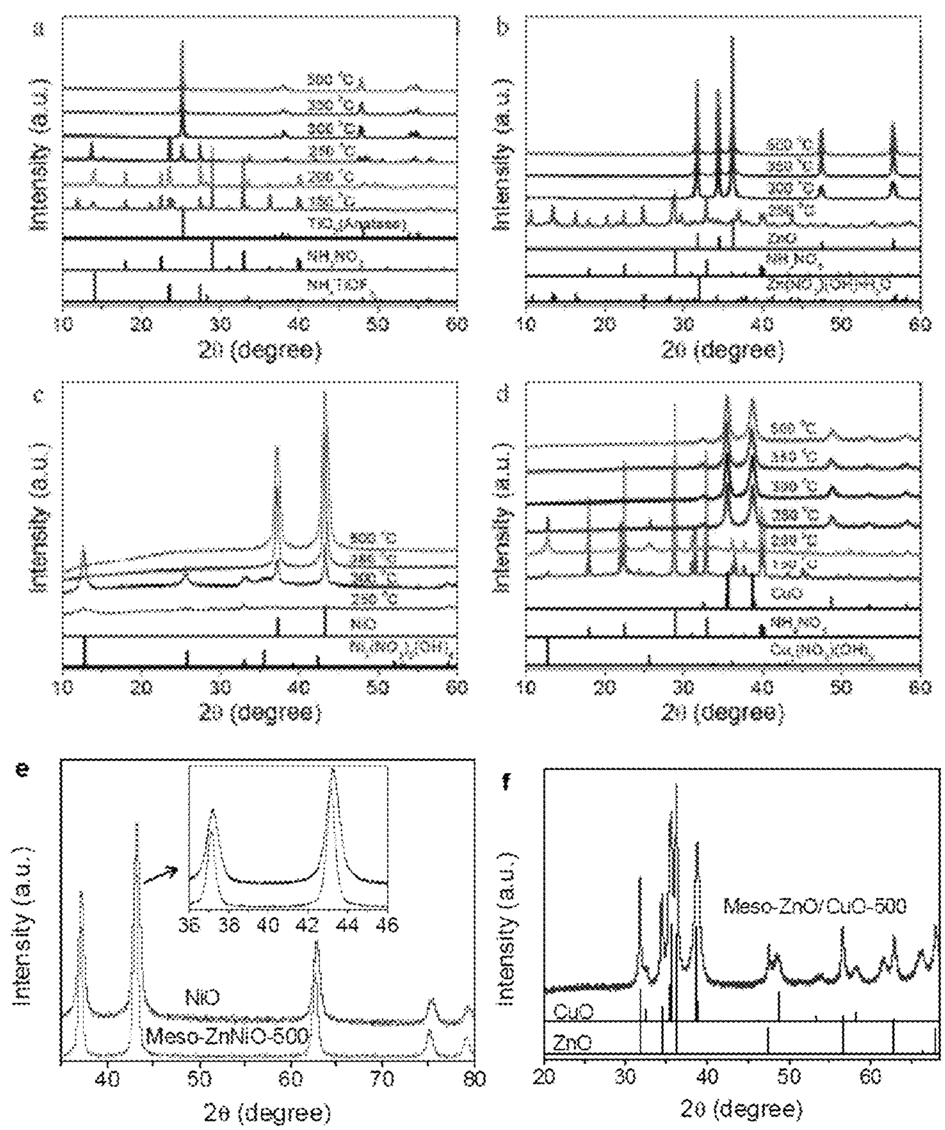
FIG. 4 shows graphs illustrating the results of powder X-ray diffraction (XRD) for the crystals of the Examples and Comparative Examples. For reference, FIG. 4 also shows peaks of anatase-type titanium oxide, $NH_4TiOF_3$, ZnO, $Zn(NO_3)(OH).H_2O$, NiO, $Ni_3(NO_3)_2(OH)_4$, CuO, $Cu_2(NO_3)(OH)_3$, and $NH_4NO_3$.

The properties of the mesocrystals of Examples 1, 4, 7, 9, 12, and 13 were measured by powder X-ray diffraction (XRD). The particle size of the metal oxide nanocrystals that constitute each of the mesocrystals of Examples 1, 4, 7, 9, 12, and 13 was assessed from the X-ray diffraction peaks, using the Scherrer equation. Table 1 and FIG. 4 show the results. FIG. 4*a* shows the results of titanium oxide (Examples 1 to 3 and Comparative Examples 1 to 3), FIG. 4*b* show the results of zinc oxide (Examples 4 to 6 and Comparative Example 4), FIG. 4*c* shows the results of nickel oxide (Examples 7 to 8 and Comparative Examples 5 to 6), FIG. 4*d* shows the results of copper oxide (Examples 9 to 11 and Comparative Examples 7 to 9), FIG. 4*e* shows the results of the oxide of a zinc-nickel alloy (Example 12), and FIG. 4*f* shows the results of the composite mesocrystal consisting of nanoparticles of an zinc oxide/copper oxide composite mesocrystal (Example 13).

TABLE 1

| | Sample | Specific Surface Area ($m^2/g$) | Pore Size (nm) | Particle Size (nm) |
|---|---|---|---|---|
| Example 1 | Meso-$TiO_2$-500 | 92 | 11 | 24 |
| Example 4 | Meso-ZnO-500 | 0.8 | 26 | 45 |
| Example 7 | Meso-NiO-500 | 15 | 3 | 14 |
| Example 9 | Meso-CuO-500 | 2.2 | 35 | 23 |
| Example 12 | Meso-ZnO/CuO-500 | 4 | 54 | 33 |
| Example 13 | Meso-ZnNiO-500 | 16 | 35 | 20 |

Test Example 4: Electron Microscopic Observation

Figure 5:
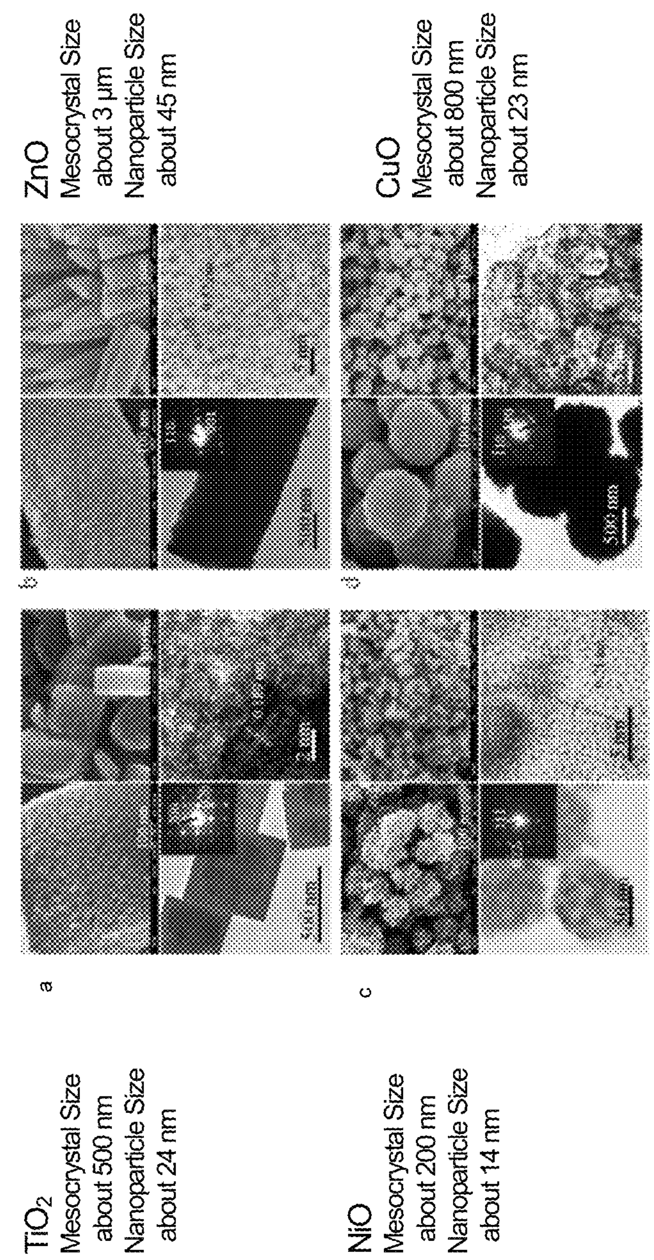
FIG. 5 shows diagrams illustrating the results of electron microscopic observation (SEM and TEM) for the mesocrystals of Examples 1, 4, 7, and 9.
Figure 6:
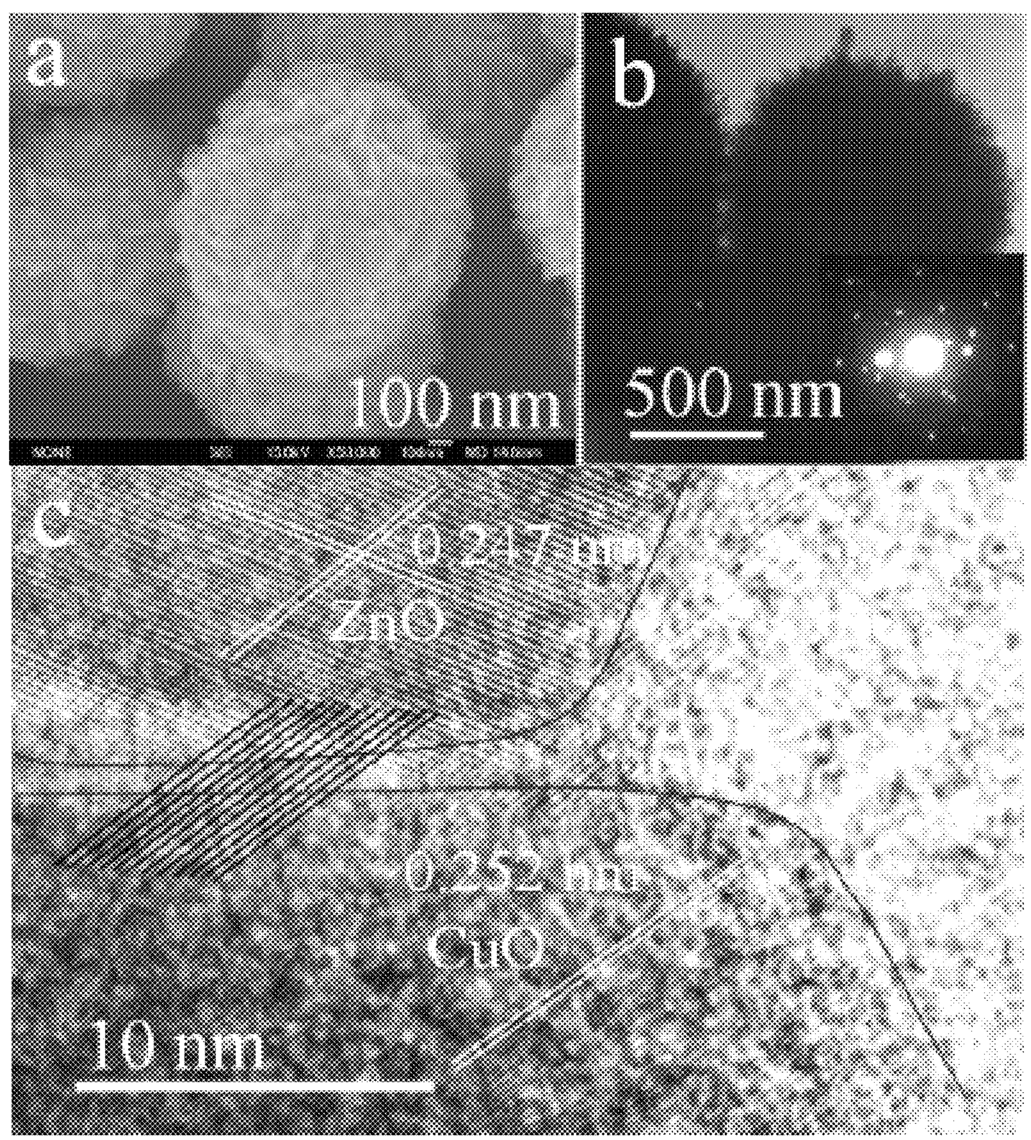
FIG. 6 shows diagrams illustrating the results of electron microscopic observation (SEM and TEM) for the composite mesocrystal of Example 12.
Figure 7:
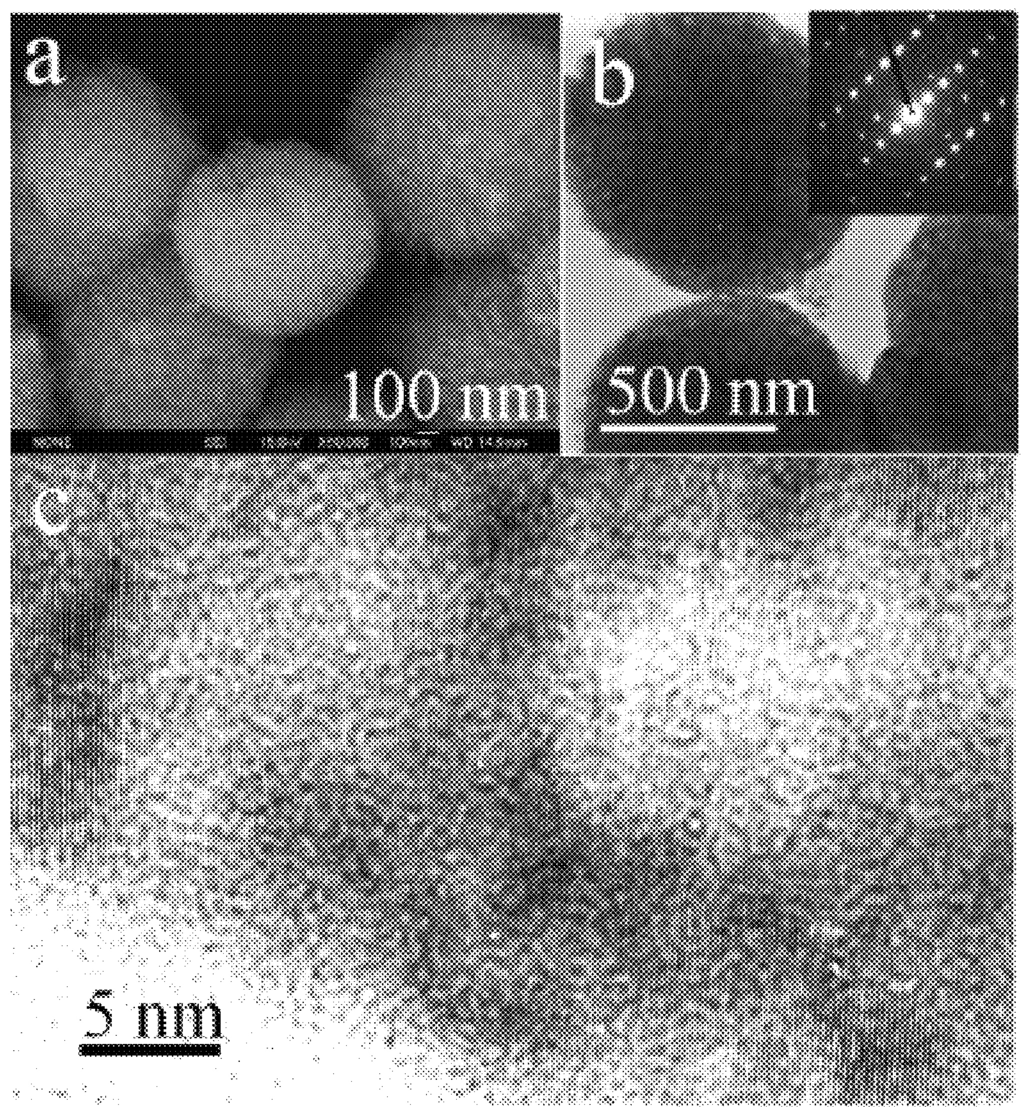
FIG. 7 shows diagrams illustrating the results of electron microscopic observation (SEM and TEM) for the composite mesocrystal of Example 13.

The properties of the mesocrystals of Examples 1, 4, 7, 9, 12, and 13 were observed with a scanning electron microscope (SEM) and a transmission electron microscope (TEM). FIGS. 5 to 7 show the results.

As shown in FIG. 5*a*, the titanium oxide mesocrystals of the present invention (in particular, Example 1) were plate-like crystals having substantially square surfaces. As shown in FIG. 5*a*, titanium oxide nanocrystals were regularly arranged. A high-resolution transmission electron microscope (HRTEM) image of contact points between titanium oxide particles showed atomic planes that correspond to (200) or (020) crystal planes of anatase in which single crystal lattices have a lattice spacing of about 0.189 nm (FIG. 5*a*). These results strongly suggest that the {001} planes were exposed on the surfaces of the titanium oxide mesocrystals of the present invention. Further, uniform lattice fringes were clearly observed, thus confirming perfectly oriented titanium oxide nanocrystals. Due to the regular arrangement of the nanocrystals, many defects and pores were formed on the surfaces (FIG. 5*a*).

The titanium oxide mesocrystals had an average thickness of about 200 nm, and an average width of about 500 nm.

Similar results were obtained for the shape and crystal structure of the titanium oxide mesocrystals of the present invention in other Examples.

As shown in FIG. 5*b*, the zinc oxide mesocrystals of the present invention (in particular, Example 4) were columnar crystals whose end portions protrude. As shown in FIG. 5*b*, zinc oxide nanocrystals are regularly arranged. Further, uniform lattice fringes were clearly observed, thus confirming perfectly oriented zinc oxide nanocrystals. Due to the regular arrangement of the nanocrystals, many defects and pores were formed on the surfaces (FIG. 5*b*).

The zinc oxide mesocrystals had an average width of about 1 μm, and an average length of about 3 μm.

Similar results were obtained for the shape and crystal structure of the zinc oxide mesocrystals of the present invention in other Examples.

As shown in FIG. 5*c*, the nickel oxide mesocrystals of the present invention (in particular, Example 7) were substantially spherical crystals. As shown in FIG. 5*c*, nickel oxide nanocrystals were regularly arranged. Further, uniform lattice fringes were clearly observed, thus confirming perfectly oriented nickel oxide nanocrystals. Due to the regular arrangement of the nanocrystals, many defects and pores were formed on the surfaces (FIG. 5*c*).

The nickel oxide mesocrystals had an average diameter of about 200 nm.

Similar results were obtained for the shape and crystal structure of the nickel oxide mesocrystals of the present invention in other Examples.

As shown in FIG. 5*d*, the copper oxide mesocrystals of the present invention (in particular, Example 9) were substantially spherical crystals. As shown in FIG. 5*d*, copper oxide nanocrystals were regularly arranged. Further, uniform lattice fringes were clearly observed, thus confirming perfectly oriented copper oxide nanocrystals. Due to the regular arrangement of the nanocrystals, many defects and pores were formed on the surfaces (FIG. 5*d*).

The copper oxide mesocrystals had an average diameter of about 800 nm.

Similar results were obtained for the shape and crystal structure of the copper oxide mesocrystals of the present invention in other Examples.

As shown in FIG. 6*a*, the zinc oxide/copper oxide composite mesocrystals of the present invention (in particular, Example 12) were substantially spherical crystals. As shown in FIG. 6*c*, the zinc oxide nanocrystals and the copper oxide nanocrystals were separately regularly arranged. A high-resolution transmission electron microscope (HRTEM) image showed that the lattice spacing was 0.247 nm in the zinc oxide nanocrystals and 0.252 nm in the copper oxide nanocrystals, and that the zinc oxide phase and the copper oxide phase were separately formed (FIG. 6*c*). That is, the zinc oxide/copper oxide composite mesocrystals were mesocrystals comprising zinc oxide nanoparticles and copper oxide nanoparticles. Further, uniform lattice fringes were clearly observed, thus confirming perfectly oriented zinc oxide nanocrystals and copper oxide nanocrystals. Due to the regular arrangement of the nanocrystals, many defects and pores were formed on the surfaces.

The zinc oxide/copper oxide composite mesocrystals had an average diameter of about 1 μm.

As shown in FIG. 7*a*, the composite mesocrystals consisting of nanoparticles of an oxide of a zinc-nickel alloy of the present invention (in particular, Example 13) were substantially spherical crystals. As shown in FIGS. 7*b* and 7*c*, the zinc oxide phase and the nickel oxide phase were not separately formed, but nanocrystals of an oxide of a zinc-nickel alloy were regularly arranged. That is, the composite mesocrystals were mesocrystals consisting of nanoparticles of an oxide of a zinc-nickel alloy. Further, uniform lattice fringes were clearly observed, thus confirming perfectly oriented nanocrystals of an oxide of a zinc-nickel alloy. Due to the regular arrangement of the nano crystals, many defects and pores were formed on the surfaces.

The composite mesocrystals consisting of nanoparticles of an oxide of a zinc-nickel alloy had an average diameter of about 800 nm.

Test Example 5: Single-Particle Fluorescence Spectroscopy

Clear photoluminescence is obtained by recombination of photogenerated electrons and holes. To evaluate the photoluminescent properties of metal oxide, single-particle fluorescence spectroscopy was performed. Fluorescence spectroscopy is a powerful method that allows observation of surface reactions with high spatial resolution.

Single-particle fluorescence images and emission decay curves were measured by the confocal scanning microscope system (PicoQuant, MicroTime 200) of an Olympus IX71 inverted fluorescence microscope. The samples were excited with a 380 nm circularly polarized pulsed laser (Spectra-Physics, MAI TAI HTS-W, Inspire Blue TAST-W with automatic frequency doubler; 0.8 MHz repetition rate, 10 μW excitation power) controlled by a PDL-800B driver (PicoQuant) through an oil immersion objective lens (Olympus, UPLSAPO 100XO; 1.40 NA, 100×). All of the experiments were performed at room temperature.

Figure 8:
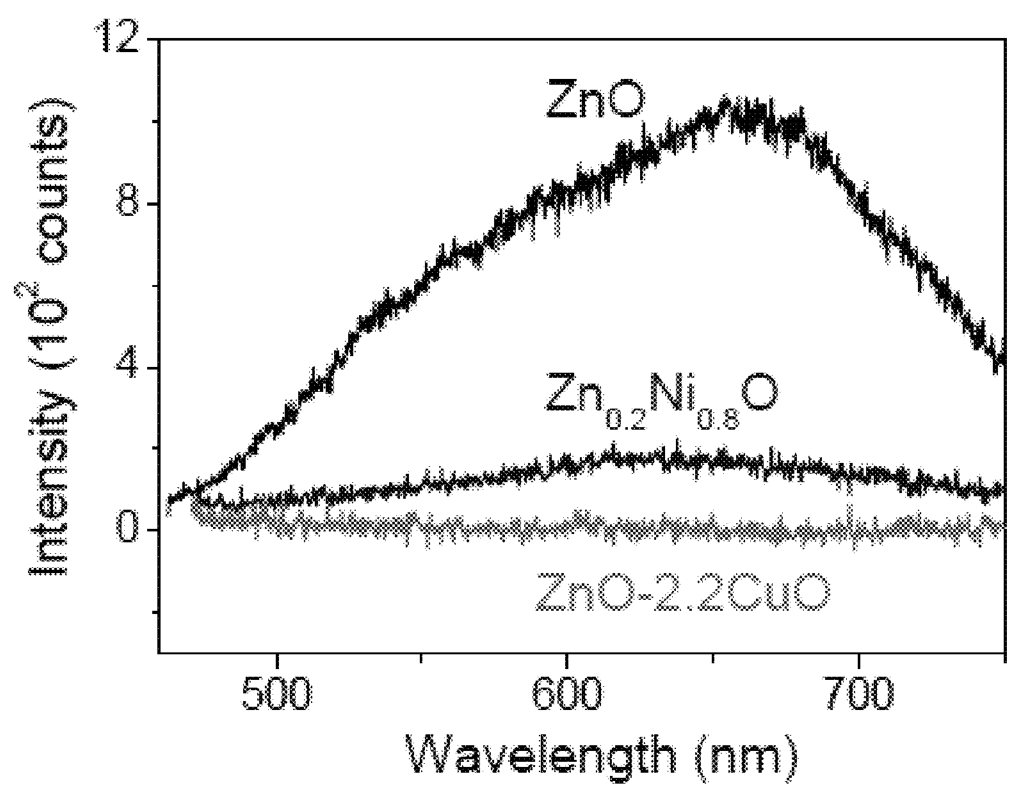
FIG. 8 is a graph illustrating the emission spectra measured by single-particle fluorescence spectroscopy for the crystals of Examples 4, 12, and 13.
Figure 9:
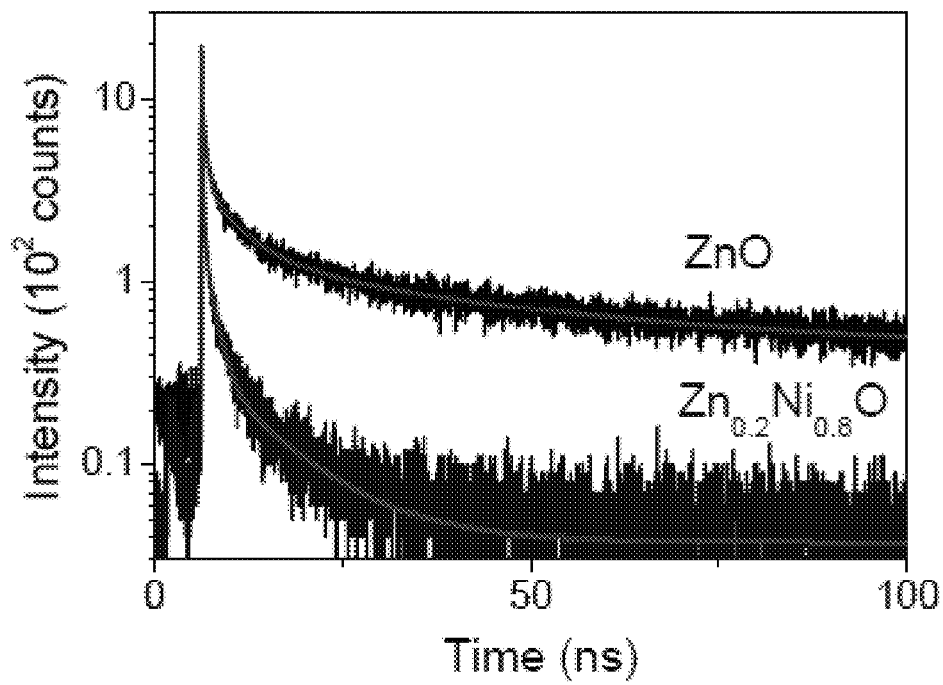
FIG. 9 is a graph illustrating the emission lifetimes measured by single-particle fluorescence spectroscopy for the crystals of Examples 4, 12, and 13.

As shown in FIG. 8, in the zinc oxide mesocrystal of Example 4, broad emission attributed to surface-trapped charges was observed in 500 to 800 nm. On the other hand, almost no emission was observed in the composite mesocrystals of Examples 12 to 13. This shows that the defect emission of zinc oxide was quenched by copper oxide and nickel (or nickel oxide). These results suggest that charge transfer occurs between different metals or between different metal oxides in the composite mesocrystals.

Emission decay curves were evaluated, and the results reveal that the intensity-weighted average decay lifetime was 26 ns in the zinc oxide mesocrystal of Example 4, and 5 ns or less in the composite mesocrystal of Example 13. This suggests that charge recombination occurs more quickly in the composite mesocrystal.

Test Example 6: Photocatalytic Activity

The photocatalytic oxidation of p-chlorophenol was measured.

An aqueous dispersion of a given mesocrystal (0.1 g/L), the dispersion containing $1.0\times10^{-4}$ M p-chlorophenol was irradiated with ultraviolet light at 365 nm using a mercury light source (REX-120). Three mesocrystal samples were used: a mixture of the zinc oxide mesocrystal of Example 4 and the copper oxide mesocrystal of Example 9, the zinc oxide/copper oxide composite mesocrystal of Example 12, and the composite mesocrystal consisting of nanoparticles of an oxide of a zinc-nickel alloy of Example 13. The intensity of the ultraviolet light was 140 mW/cm$^2$. Each sample was centrifuged to remove particles. After removing the powder, the rate of p-chlorophenol degradation was determined from the change in absorbance by ultraviolet-visible absorption spectroscopy with an ultraviolet spectrophotometer (UV-3100, Shimadzu Corporation).

Figure 10:
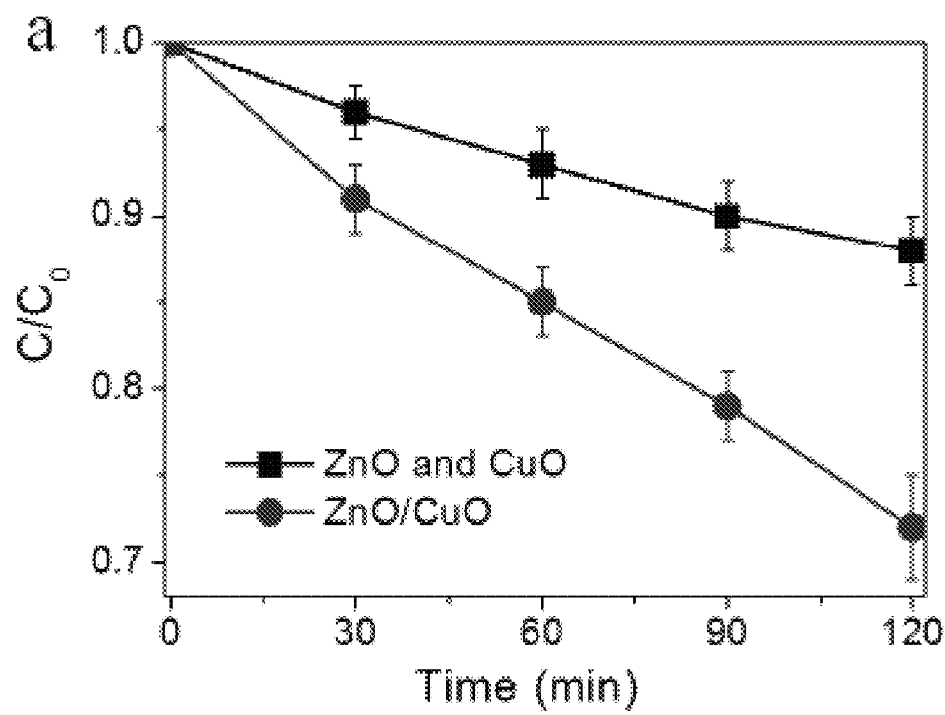
FIG. 10 is a graph illustrating the results of a test for photocatalytic degradation of p-chlorophenol.
Figure 11:
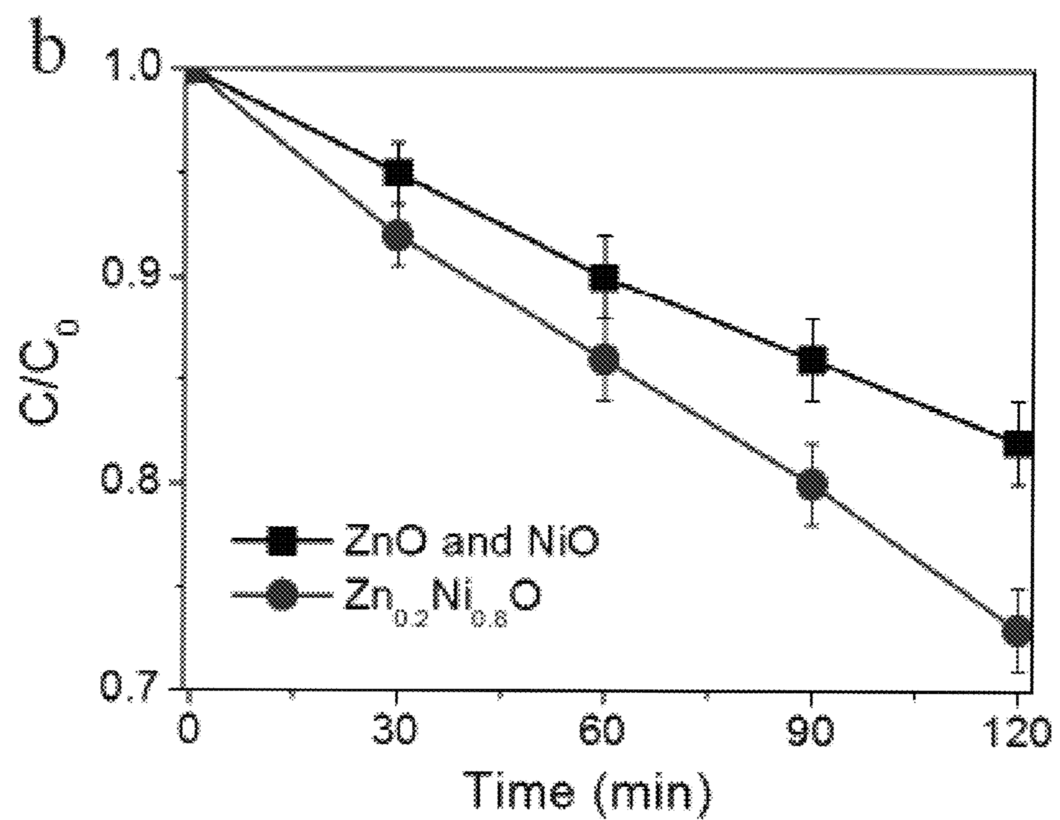
FIG. 11 is a graph illustrating the results of a test for photocatalytic degradation of p-chlorophenol.

FIGS. 10 and 11 show the results. When no mesocrystal was added, little degradation occurred. In contrast, degradation was promoted when a mixture of the zinc oxide mesocrystal of Example 4 and the copper oxide mesocrystal of Example 9 was used. When the zinc oxide/copper oxide composite mesocrystal of Example 12, or the composite mesocrystal consisting of nanoparticles of an oxide of a zinc-nickel alloy of Example 13 was used, degradation was promoted about two-fold relative to the case where a mixture of the zinc oxide mesocrystal of Example 4 and the copper oxide mesocrystal of Example 9 was used. From the results, it is believed that reaction efficiency was improved by the increase in specific surface area due to formation of composite mesocrystals, and by suppression of the charge recombination process due to charge transfer between different metals or between different metal oxides.

Test Example 7: Structural Analysis of the Mesocrystal of Example 12

To analyze the structure of the composite mesocrystal of Example 12, high-angle annular dark-field scanning transmission electron microscopy (HAADF-STEM) and energy-dispersive X-ray spectrometry (EDX) were performed.

As a result, ZnO nanocrystals and CuO nanocrystals were distributed on the surface of the mesocrystal sphere of a ZnO/CuO single crystal (FIG. 12(*a*) to (*c*)). The EDX pattern (FIG. 12(*b*)) reveals that the molar content of ZnO nanoparticles on the surface was about 36%. As seen from FIG. 12(*c*), the signal intensity patterns of zinc and copper were different. The Cu profile was more flat because of the abundance of CuO, whereas the Zn profile had peaks suggesting the presence of the ZnO nanocrystals on the surface. The intersections of the two profiles are interfaces between ZnO and CuO nanocrystals. To investigate the internal distribution of ZnO nanocrystals and CuO nanocrystals in the ZnO/CuO mesocrystal, the mesocrystal sample was sectioned by an ultramicrotome to reveal its cross section.

FIG. 12(*d*) is a cross-sectional HAADF-STEM image. There were many pores of different sizes in the ZnO/CuO mesocrystal, inferring that the mesocrystal was assembled by small nanoparticles.

The internal composition of the ZnO/CuO mesocrystal was further investigated by HAADF-STEM-EDX elemental mapping analysis, which revealed the nanoscale elemental composition as well as the spatial uniformity of the element distribution in the ZnO/CuO mesocrystal (FIG. 12(*e*) to (*g*)). The EDX elemental mapping results reveal that Cu and O were homogeneously distributed in the mesocrystal (FIGS. 12(*e*) and (*f*)), whereas Zn was detected as punctate dots over the entire mesocrystal (FIG. 12(*g*)). Moreover, high-resolution HAADF-STEM-EDX mapping analysis reveals that ZnO nanocrystals and CuO nanocrystals in the mesocrystal were in physical contact with each other, suggesting that electrons were exchanged between them.

Test Example 8: Electron Spin Resonance Spectra

The electron spin resonance spectra (EPR spectra) of the mesocrystals obtained in Examples 4, 9, and 12 were measured at 77K in a vacuum. FIG. 13 shows the results.

In the ZnO mesocrystal, both the observed and simulated EPR spectra exhibited strong resonance signals at g=1.960 and g=2.005 in the absence of UV irradiation (solid lines). The resonance signal at g=1.960 indicates shallow donor states (SDS) due to impurities or defects in ZnO (possibly singly ionized oxygen vacancies ($Vo^+$)). The resonance signal at g=2.005 indicates two mutually adjacent zinc vacancies with one hole ($((V_Z^-)_2^-)$). After UV light irradiation, a resonance signal at g=2.019 indicating a zinc vacancy with a hole was observed (dashed lines), and photogenerated charges localized on one of the four oxygen ions, $V_Z^-$, and an internode neutral zinc atom $Zn_i^0$ were formed.

In the case of the CuO mesocrystal, no such EPR signals as described above were observed in the absence of UV light irradiation or under UV light irradiation (spectra (2)).

In the case of the ZnO/CuO mesocrystal, only an EPR resonance signal at g=2.005 was observed in the absence of UV irradiation and under UV irradiation (spectra (3)).

The above results suggest that photogenerated charges in ZnO effectively transferred to CuO because of the intimate contact between adjacent nanocrystals.

Test Example 9: Time-Resolved Diffuse Reflectance Spectroscopy

To clarify the super interfacial charge transfer dynamics, femtosecond-scale time-resolved diffuse reflectance spectroscopy measurement was performed for the mesocrystals obtained in Examples 4, 9, and 12. FIG. 14 shows the results.

Immediately after the 330-nm laser excitation of the ZnO/CuO mesocrystal sample, a broad absorption band was observed in the near-infrared (NIR) wavelength region (FIG. 14(*a*)).

The observed absorption spectrum is considered to overlap those of the trapped electrons and free electrons (increasing monotonically from the visible to NIR regions) in ZnO. The decay times measured at 1,100 nm in the ZnO/CuO mesocrystal were 0.43 picoseconds (90%) and 11 picoseconds (10%) (FIG. 14(*b*)).

Furthermore, the transient absorption spectrum of the ZnO/CuO mesocrystal at 100 picoseconds exhibited the accumulation of CuO charges in the mesocrystal. These results suggest that photogenerated charges in ZnO effectively transferred to CuO because of the intimate contact between adjacent nanocrystals in the mesocrystal.

We claim:

1. A method for producing a metal oxide mesocrystal, the method comprising the step of maintaining an aqueous precursor solution comprising one or more metal oxide precursors, an ammonium salt, a surfactant, and water at 300 to 600° C.

2. The method according to claim 1, wherein the one or more metal oxide precursors are a metal nitrate and/or a metal fluoride salt.

3. The method according to claim 1, wherein the ammonium salt is $NH_4NO_3$.

4. The method according to claim 1, wherein the surfactant is at least one member selected from the group consisting of anionic surfactants, cationic surfactants, amphoteric surfactants, and nonionic surfactants.

5. The method according to claim 1, wherein, in the aqueous precursor solution, the molar ratio of metal oxide precursor to surfactant is 1 to 1000:1, and the molar ratio of ammonium salt to surfactant is 1 to 1000:1.

* * * * *